(12) United States Patent
Taylor et al.

(10) Patent No.: US 9,837,842 B2
(45) Date of Patent: Dec. 5, 2017

(54) SYSTEMS AND METHODS FOR UTILIZING AN ARRAY OF POWER STORAGE DEVICES, SUCH AS BATTERIES

(71) Applicant: Gogoro Inc., Hong Kong (CN)

(72) Inventors: Matthew Whiting Taylor, North Bend, WA (US); Hok-Sum Horace Luke, Mercer Island, WA (US)

(73) Assignee: Gogoro Inc., Hong Kong (CN)

( * ) Notice: Subject to any disclaimer, the term of this patent is extended or adjusted under 35 U.S.C. 154(b) by 222 days.

(21) Appl. No.: 14/601,840

(22) Filed: Jan. 21, 2015

(65) Prior Publication Data

US 2015/0207355 A1    Jul. 23, 2015

Related U.S. Application Data

(60) Provisional application No. 61/930,727, filed on Jan. 23, 2014.

(51) Int. Cl.
*H02J 7/00* (2006.01)
*H02J 7/34* (2006.01)

(52) U.S. Cl.
CPC ............. *H02J 7/0063* (2013.01); *H02J 7/345* (2013.01); *H02J 2007/0067* (2013.01)

(58) Field of Classification Search
CPC .............................. H02J 7/0016; H02J 7/0024
(Continued)

(56) References Cited

U.S. PATENT DOCUMENTS 1,387,848 A    8/1921   Good
3,470,974 A    10/1969  Pefine
(Continued)

FOREIGN PATENT DOCUMENTS

CA    2 865 976 A1    9/2013
DE    44 32 539 A1    6/1995
(Continued)

OTHER PUBLICATIONS

"Inrunner," retrieved from URL=http://en.wikipedia.org/w/index.php?title=Inrunner&printable=yes on Sep. 28, 2011, 1 page.
(Continued)

*Primary Examiner* — Edward Tso
*Assistant Examiner* — Ahmed Omar
(74) *Attorney, Agent, or Firm* — Perkins Coie LLP

(57) ABSTRACT

A system for utilizing an array of electrical energy storage devices utilizes a smart manager that categorizes electrical energy storage devices in the array based on electrical energy storage device age and/or internal resistance level and causes those electrical energy storage devices with similar ages and/or resistance levels to be concurrently depleted. This is followed by concurrently depleting the electrical energy storage devices in a different category. The system also disconnects faulty electrical energy storage devices in the array and helps alleviate the need to carefully consider and reconfigure the location of individual electrical energy storage devices in the array. The system facilitates forecasting actual capacity and thus helps to guarantee available capacity and to actively maintain capacity via maintenance crews that need simply remove and replace cells as advised by the smart manager. The system 100 facilitates permitting a quality of service (QoS) to be provided to mission critical entities (banks, hospitals, etc.).

28 Claims, 8 Drawing Sheets

(58) Field of Classification Search
USPC .................................................. 320/118, 117
See application file for complete search history.

(56) References Cited

U.S. PATENT DOCUMENTS

| | | | |
|---|---|---|---|
| 3,664,450 A | 5/1972 | Udden et al. |
| 3,678,455 A | 7/1972 | Levey |
| 4,087,895 A | 5/1978 | Etienne |
| 4,129,759 A | 12/1978 | Hug |
| 4,216,839 A | 8/1980 | Gould et al. |
| 4,669,570 A | 6/1987 | Perret |
| 5,187,423 A | 2/1993 | Marton |
| 5,189,325 A | 2/1993 | Jarczynski |
| 5,236,069 A | 8/1993 | Peng |
| 5,339,250 A | 8/1994 | Durbin |
| 5,349,535 A | 9/1994 | Gupta |
| 5,376,869 A | 12/1994 | Konrad |
| 5,544,784 A | 8/1996 | Malaspina |
| 5,596,261 A | 1/1997 | Suyama |
| 5,627,752 A | 5/1997 | Buck et al. |
| 5,631,536 A | 5/1997 | Tseng |
| 5,642,270 A | 6/1997 | Green et al. |
| 5,815,824 A | 9/1998 | Saga et al. |
| 5,839,800 A | 11/1998 | Koga et al. |
| 5,898,282 A | 4/1999 | Drozdz et al. |
| 5,998,963 A | 12/1999 | Aarseth |
| 6,016,882 A | 1/2000 | Ishikawa |
| 6,154,006 A | 11/2000 | Hatanaka et al. |
| 6,177,867 B1 | 1/2001 | Simon et al. |
| 6,177,879 B1 | 1/2001 | Kokubu et al. |
| 6,236,333 B1 | 5/2001 | King |
| 6,403,251 B1 | 6/2002 | Baggaley et al. |
| 6,498,457 B1 | 12/2002 | Tsuboi |
| 6,515,580 B1 | 2/2003 | Isoda et al. |
| 6,583,592 B2 | 6/2003 | Omata et al. |
| 6,593,713 B2 | 7/2003 | Morimoto et al. |
| 6,796,396 B2 | 9/2004 | Kamen et al. |
| 6,822,560 B2 | 11/2004 | Geber et al. |
| 6,854,773 B2 | 2/2005 | Lin |
| 6,899,268 B2 | 5/2005 | Hara |
| 6,952,795 B2 | 10/2005 | O'Gorman et al. |
| 7,010,682 B2 | 3/2006 | Reinold et al. |
| 7,111,179 B1 | 9/2006 | Girson et al. |
| 7,131,005 B2 | 10/2006 | Levenson et al. |
| 7,392,068 B2 | 6/2008 | Dayan et al. |
| 7,415,332 B2 | 8/2008 | Ito et al. |
| 7,426,910 B2 | 9/2008 | Elwart |
| 7,495,543 B2 | 2/2009 | Denison et al. |
| 7,567,166 B2 | 7/2009 | Bourgine De Meder |
| 7,592,728 B2 | 9/2009 | Jones et al. |
| 7,596,709 B2 | 9/2009 | Cooper et al. |
| 7,617,893 B2 | 11/2009 | Syed et al. |
| 7,698,044 B2 | 4/2010 | Prakash et al. |
| 7,728,548 B2 | 6/2010 | Daynes et al. |
| 7,761,307 B2 | 7/2010 | Ochi et al. |
| 7,778,746 B2 | 8/2010 | McLeod et al. |
| 7,863,858 B2 | 1/2011 | Gangstoe et al. |
| 7,868,591 B2 | 1/2011 | Phillips et al. |
| 7,898,439 B2 | 3/2011 | Bettez et al. |
| 7,908,020 B2 | 3/2011 | Pieronek |
| 7,923,144 B2 | 4/2011 | Kohn et al. |
| 7,948,207 B2 | 5/2011 | Scheucher |
| 7,979,147 B1 | 7/2011 | Dunn |
| 7,993,155 B2 | 8/2011 | Heichal et al. |
| 8,006,793 B2 | 8/2011 | Heichal et al. |
| 8,006,973 B2 | 8/2011 | Toba et al. |
| 8,013,571 B2 | 9/2011 | Agassi et al. |
| 8,035,341 B2 | 10/2011 | Genzel et al. |
| 8,035,349 B2 | 10/2011 | Lubawy |
| 8,063,762 B2 | 11/2011 | Sid |
| 8,068,952 B2 | 11/2011 | Valentine et al. |
| 8,098,050 B2 | 1/2012 | Takahashi |
| 8,106,631 B2 | 1/2012 | Abe |
| 8,118,132 B2 | 2/2012 | Gray, Jr. |
| 8,164,300 B2 | 4/2012 | Agassi et al. |
| 8,219,839 B2 | 7/2012 | Akimoto |
| 8,229,625 B2 | 7/2012 | Lal et al. |
| 8,265,816 B1 | 9/2012 | LaFrance |
| 8,301,365 B2 | 10/2012 | Niwa et al. |
| 8,319,605 B2 | 11/2012 | Hassan et al. |
| 8,326,259 B2 | 12/2012 | Gautama et al. |
| 8,354,768 B2 | 1/2013 | Cipriani |
| 8,355,965 B2 | 1/2013 | Yamada |
| 8,378,627 B2 | 2/2013 | Asada et al. |
| 8,412,401 B2 | 4/2013 | Bertosa et al. |
| 8,437,908 B2 | 5/2013 | Goff et al. |
| 8,447,598 B2 | 5/2013 | Chutorash et al. |
| 8,560,147 B2 | 10/2013 | Taylor et al. |
| 8,564,241 B2 | 10/2013 | Masuda |
| 8,614,565 B2 | 12/2013 | Lubawy |
| 8,725,135 B2 | 5/2014 | Weyl et al. |
| 8,798,852 B1 | 8/2014 | Chen et al. |
| 8,862,304 B2 | 10/2014 | Chen et al. |
| 8,862,388 B2 | 10/2014 | Wu et al. |
| 8,878,487 B2 | 11/2014 | Wu et al. |
| 2001/0018903 A1 | 9/2001 | Hirose et al. |
| 2001/0035737 A1* | 11/2001 | Nakanishi .......... G01R 31/3624 320/122 |
| 2002/0023789 A1 | 2/2002 | Morisawa et al. |
| 2002/0070851 A1 | 6/2002 | Raichle et al. |
| 2003/0141840 A1 | 7/2003 | Sanders |
| 2003/0163434 A1 | 8/2003 | Barends |
| 2003/0209375 A1 | 11/2003 | Suzuki et al. |
| 2004/0036446 A1 | 2/2004 | Iwashima |
| 2004/0236615 A1 | 11/2004 | Msndy |
| 2004/0246119 A1 | 12/2004 | Martin et al. |
| 2006/0047380 A1 | 3/2006 | Welch |
| 2006/0092583 A1 | 5/2006 | Alahmad et al. |
| 2006/0208850 A1 | 9/2006 | Ikeuchi et al. |
| 2006/0284601 A1 | 12/2006 | Salasoo et al. |
| 2007/0026996 A1 | 2/2007 | Ayabe et al. |
| 2007/0035397 A1 | 2/2007 | Patenaude et al. |
| 2007/0069687 A1 | 3/2007 | Suzuki |
| 2007/0090921 A1 | 4/2007 | Fisher |
| 2007/0108946 A1* | 5/2007 | Yamauchi ............. H01M 10/42 320/132 |
| 2007/0145945 A1 | 6/2007 | McGinley et al. |
| 2007/0159297 A1 | 7/2007 | Paulk et al. |
| 2007/0208468 A1 | 9/2007 | Sankaran et al. |
| 2008/0276110 A1 | 11/2008 | Indiani et al. |
| 2009/0024872 A1 | 1/2009 | Beverly |
| 2009/0033456 A1 | 2/2009 | Castillo et al. |
| 2009/0082957 A1 | 3/2009 | Agassi et al. |
| 2009/0112394 A1 | 4/2009 | Lepejian et al. |
| 2009/0158790 A1 | 6/2009 | Oliver |
| 2009/0294188 A1 | 12/2009 | Cole |
| 2010/0026238 A1 | 2/2010 | Suzuki et al. |
| 2010/0051363 A1 | 3/2010 | Inoue et al. |
| 2010/0052588 A1 | 3/2010 | Okamura et al. |
| 2010/0089547 A1 | 4/2010 | King et al. |
| 2010/0094496 A1 | 4/2010 | Hershkovitz et al. |
| 2010/0114798 A1 | 5/2010 | Sirton |
| 2010/0114800 A1 | 5/2010 | Yasuda et al. |
| 2010/0161481 A1 | 6/2010 | Littrell |
| 2010/0198535 A1 | 8/2010 | Brown et al. |
| 2010/0198754 A1 | 8/2010 | Jones et al. |
| 2010/0201482 A1 | 8/2010 | Robertson et al. |
| 2010/0235043 A1 | 9/2010 | Seta et al. |
| 2010/0250043 A1 | 9/2010 | Scheucher |
| 2010/0261043 A1 | 10/2010 | Kim et al. |
| 2010/0308989 A1 | 12/2010 | Gasper |
| 2011/0025267 A1 | 2/2011 | Kamen et al. |
| 2011/0029157 A1 | 2/2011 | Muzaffer |
| 2011/0032110 A1 | 2/2011 | Taguchi |
| 2011/0071932 A1 | 3/2011 | Agassi et al. |
| 2011/0082621 A1 | 4/2011 | Berkobin et al. |
| 2011/0106329 A1 | 5/2011 | Donnelly et al. |
| 2011/0112710 A1 | 5/2011 | Meyer-Ebeling et al. |
| 2011/0114798 A1 | 5/2011 | Gemmati |
| 2011/0120789 A1 | 5/2011 | Teraya |
| 2011/0148346 A1 | 6/2011 | Gagosz et al. |
| 2011/0153141 A1 | 6/2011 | Beechie et al. |
| 2011/0160992 A1 | 6/2011 | Crombez |
| 2011/0169447 A1 | 7/2011 | Brown et al. |

(56) References Cited

U.S. PATENT DOCUMENTS

| | | |
|---|---|---|
| 2011/0200193 A1 | 8/2011 | Blitz et al. |
| 2011/0202476 A1 | 8/2011 | Nagy et al. |
| 2011/0218703 A1 | 9/2011 | Uchida |
| 2011/0224900 A1 | 9/2011 | Hiruta et al. |
| 2011/0241824 A1 | 10/2011 | Uesugi |
| 2011/0260691 A1 | 10/2011 | Ishibashi et al. |
| 2011/0270480 A1 | 11/2011 | Ishibashi et al. |
| 2011/0279257 A1 | 11/2011 | Au et al. |
| 2011/0292667 A1 | 12/2011 | Meyers |
| 2011/0295454 A1 | 12/2011 | Meyers |
| 2011/0303509 A1 | 12/2011 | Agassi et al. |
| 2012/0000720 A1 | 1/2012 | Honda et al. |
| 2012/0013182 A1 | 1/2012 | Minegishi et al. |
| 2012/0019196 A1 | 1/2012 | Fung |
| 2012/0038473 A1 | 2/2012 | Fecher |
| 2012/0062361 A1 | 3/2012 | Kosugi |
| 2012/0068817 A1 | 3/2012 | Fisher |
| 2012/0078413 A1 | 3/2012 | Baker, Jr. |
| 2012/0105078 A1 | 5/2012 | Kikuchi et al. |
| 2012/0109519 A1 | 5/2012 | Uyeki |
| 2012/0123661 A1 | 5/2012 | Gray, Jr. |
| 2012/0126969 A1 | 5/2012 | Wilbur et al. |
| 2012/0157083 A1 | 6/2012 | Otterson |
| 2012/0158229 A1 | 6/2012 | Schaefer |
| 2012/0167071 A1 | 6/2012 | Paek |
| 2012/0194346 A1 | 8/2012 | Tsai et al. |
| 2012/0223575 A1 | 9/2012 | Hachiya et al. |
| 2012/0248868 A1 | 10/2012 | Mobin et al. |
| 2012/0248869 A1 | 10/2012 | Itagaki et al. |
| 2012/0253567 A1 | 10/2012 | Levy et al. |
| 2012/0256588 A1 | 10/2012 | Hayashi et al. |
| 2012/0259665 A1 | 10/2012 | Pandhi et al. |
| 2012/0271723 A1 | 10/2012 | Penilla et al. |
| 2012/0280573 A1 | 11/2012 | Ohkura et al. |
| 2012/0296512 A1 | 11/2012 | Lee et al. |
| 2012/0299537 A1 | 11/2012 | Kikuchi |
| 2012/0299721 A1 | 11/2012 | Jones |
| 2012/0316671 A1 | 12/2012 | Hammerslag et al. |
| 2013/0024306 A1 | 1/2013 | Shah et al. |
| 2013/0026971 A1 | 1/2013 | Luke et al. |
| 2013/0026972 A1 | 1/2013 | Luke et al. |
| 2013/0026973 A1 | 1/2013 | Luke et al. |
| 2013/0027183 A1 | 1/2013 | Wu et al. |
| 2013/0030580 A1 | 1/2013 | Luke et al. |
| 2013/0030581 A1 | 1/2013 | Luke et al. |
| 2013/0030630 A1 | 1/2013 | Luke et al. |
| 2013/0030920 A1 | 1/2013 | Wu et al. |
| 2013/0031318 A1 | 1/2013 | Chen et al. |
| 2013/0033203 A1 | 2/2013 | Luke et al. |
| 2013/0046457 A1 | 2/2013 | Pettersson |
| 2013/0074411 A1 | 3/2013 | Ferguson et al. |
| 2013/0090795 A1 | 4/2013 | Luke et al. |
| 2013/0093271 A1 | 4/2013 | Luke et al. |
| 2013/0093368 A1 | 4/2013 | Luke et al. |
| 2013/0093384 A1 | 4/2013 | Nyu et al. |
| 2013/0116892 A1 | 5/2013 | Wu et al. |
| 2013/0119898 A1 | 5/2013 | Ohkura |
| 2013/0127416 A1 | 5/2013 | Karner et al. |
| 2013/0132307 A1 | 5/2013 | Phelps et al. |
| 2013/0151049 A1 | 6/2013 | Higashitani et al. |
| 2013/0166119 A1 | 6/2013 | Kummer et al. |
| 2013/0179061 A1 | 7/2013 | Gadh et al. |
| 2013/0181582 A1 | 7/2013 | Luke et al. |
| 2013/0200845 A1 | 8/2013 | Bito |
| 2013/0221928 A1 | 8/2013 | Kelty et al. |
| 2013/0254097 A1 | 9/2013 | Marathe et al. |
| 2013/0278216 A1 | 10/2013 | Son et al. |
| 2013/0282254 A1 | 10/2013 | Dwan et al. |
| 2014/0019043 A1 | 1/2014 | Wu et al. |
| 2014/0028089 A1 | 1/2014 | Luke et al. |
| 2014/0042973 A1* | 2/2014 | Kawahara ............ H01M 10/441 320/118 |
| 2014/0053620 A1 | 2/2014 | Taylor et al. |
| 2014/0111121 A1 | 4/2014 | Wu |
| 2014/0142786 A1 | 5/2014 | Huang et al. |
| 2014/0163813 A1 | 6/2014 | Chen et al. |
| 2014/0253021 A1 | 9/2014 | Luke et al. |
| 2014/0266006 A1 | 9/2014 | Luke et al. |
| 2014/0277844 A1 | 9/2014 | Luke |
| 2014/0279576 A1 | 9/2014 | Luke |
| 2014/0368032 A1 | 12/2014 | Doerndorfer |
| 2015/0042157 A1 | 2/2015 | Chen et al. |

FOREIGN PATENT DOCUMENTS

| | | |
|---|---|---|
| EP | 0 693 813 A1 | 1/1996 |
| EP | 1 177 955 A2 | 2/2002 |
| EP | 1 798 100 A2 | 6/2007 |
| EP | 2 101 390 A2 | 9/2009 |
| EP | 2 230 146 A2 | 9/2010 |
| EP | 2 428 939 A1 | 3/2012 |
| JP | 07-031008 A | 1/1995 |
| JP | 7-36504 U | 7/1995 |
| JP | 9-119839 A | 5/1997 |
| JP | 10-170293 A | 6/1998 |
| JP | 10-307952 A | 11/1998 |
| JP | 11-049079 A | 2/1999 |
| JP | 11-51681 A | 2/1999 |
| JP | 11-176487 A | 7/1999 |
| JP | 11-205914 A | 7/1999 |
| JP | 2000-102102 A | 4/2000 |
| JP | 2000-102103 A | 4/2000 |
| JP | 2000-341868 A | 12/2000 |
| JP | 2001-128301 A | 5/2001 |
| JP | 2003-118397 A | 4/2003 |
| JP | 2003-262525 A | 9/2003 |
| JP | 2005-67453 A | 3/2005 |
| JP | 2006-121874 A | 5/2006 |
| JP | 2007-60353 A | 3/2007 |
| JP | 2007-325458 A | 12/2007 |
| JP | 2008-127894 A | 6/2008 |
| JP | 2008-219953 A | 9/2008 |
| JP | 2008-285075 A | 11/2008 |
| JP | 2009-33936 A | 2/2009 |
| JP | 2009-512035 A | 3/2009 |
| JP | 2009-171646 A | 7/2009 |
| JP | 2009-171647 A | 7/2009 |
| JP | 4319289 B2 | 8/2009 |
| JP | 2009-303364 A | 12/2009 |
| JP | 2010-022148 A | 1/2010 |
| JP | 2010-108833 A | 5/2010 |
| JP | 2010-148246 A | 7/2010 |
| JP | 2010-191636 A | 9/2010 |
| JP | 2010-200405 A | 9/2010 |
| JP | 2010-269686 A | 12/2010 |
| JP | 2010-540907 A | 12/2010 |
| JP | 2011-126452 A | 6/2011 |
| JP | 2011-131631 A | 7/2011 |
| JP | 2011-131805 A | 7/2011 |
| JP | 2011-142704 A | 7/2011 |
| JP | 2011-233470 A | 11/2011 |
| JP | 2012-151916 A | 8/2012 |
| JP | 2012-526409 A | 10/2012 |
| KR | 1998-045020 U | 9/1998 |
| KR | 2004-0005146 A | 1/2004 |
| KR | 20100012401 A | 2/2010 |
| KR | 10-0971278 B1 | 7/2010 |
| KR | 20110004292 A | 1/2011 |
| KR | 20110041783 A | 4/2011 |
| KR | 20120020554 A | 3/2012 |
| KR | 10-2013-0046234 A | 5/2013 |
| TW | 200836452 A | 9/2008 |
| TW | I315116 B | 9/2009 |
| TW | M371880 U1 | 1/2010 |
| TW | M379269 U1 | 4/2010 |
| TW | M379789 U1 | 5/2010 |
| TW | M385047 U1 | 7/2010 |
| TW | 201043986 A1 | 12/2010 |
| TW | 201044266 A1 | 12/2010 |
| WO | 98/21132 A1 | 5/1998 |
| WO | 2009/039454 A1 | 3/2009 |
| WO | 2009128079 | 10/2009 |
| WO | 2010/005052 A2 | 1/2010 |
| WO | 2010/033517 A2 | 3/2010 |

(56) References Cited

FOREIGN PATENT DOCUMENTS

| | | |
|---|---|---|
| WO | 2010/033881 A1 | 3/2010 |
| WO | 2010042517 | 4/2010 |
| WO | 2010/143483 A1 | 12/2010 |
| WO | 2011/138205 A1 | 11/2011 |
| WO | 2012/085992 A1 | 6/2012 |
| WO | 2012143996 | 10/2012 |
| WO | 2012/160407 A1 | 11/2012 |
| WO | 2012/160557 A2 | 11/2012 |
| WO | 2013/024483 A2 | 2/2013 |
| WO | 2013/024484 A1 | 2/2013 |
| WO | 2013/042216 A1 | 3/2013 |
| WO | 2013/074819 A1 | 5/2013 |
| WO | 2013/080211 A1 | 6/2013 |
| WO | 2013/102894 A1 | 7/2013 |
| WO | 2013/108246 A2 | 7/2013 |
| WO | 2013/118113 A2 | 8/2013 |
| WO | 2013/128007 A2 | 9/2013 |
| WO | 2013/128009 A2 | 9/2013 |
| WO | 2013/128009 A3 | 9/2013 |
| WO | 2013/142154 A1 | 9/2013 |
| WO | 2013/144951 A1 | 10/2013 |

OTHER PUBLICATIONS

"Outrunner," retreived from URL=http://en.wikipedia.org/w/index.php?title=Outrunner&printable=yes on Sep. 16, 2011, 2 pages.
Chen et al., "Adjusting Electric Vehicle Systems Based on an Electrical Energy Storage Device Thermal Profile," U.S. Appl. No. 61/862,854, filed Aug. 6, 2013, 74 pages.
Chen et al., "Adjusting Electric Vehicle Systems Based on an Electrical Energy Storage Device Thermal Profile," U.S. Appl. No. 14/453,119, filed Aug. 6, 2014, 74 pages.
Chen et al., "Apparatus, System, and Method for Authentication of Vehicular Components," U.S. Appl. No. 61/783,041, filed Mar. 14, 2013, 84 pages.
Chen et al., "Apparatus, System, and Method for Authentication of Vehicular Components," Office Action dated Nov. 22, 2013, for U.S. Appl. No. 13/918,703, 35 pages.
Chen et al., "Apparatus, System, and Method for Authentication of Vehicular Components," Notice of Allowance dated Mar. 25, 2014, for U.S. Appl. No. 13/918,703, 7 pages.
Chen et al., "Apparatus, Method and Article for Providing Vehicle Diagnostic Data," Office Action dated Dec. 30, 2013, for U.S. Appl. No. 14/022,134, 20 pages.
Chen et al., "Apparatus, Method and Article for Providing Vehicle Diagnostic Data," Office Action dated Apr. 9, 2014, for U.S. Appl. No. 14/022,134, 20 pages.
Chen et al., "Apparatus, Method and Article for Providing Vehicle Diagnostic Data," Notice of Allowance dated Jul. 9, 2014, for U.S. Appl. No. 14/022,134, 10 pages.
Chen et al., "Apparatus, Method and Article for Providing Vehicle Diagnostic Data," Office Action dated Jun. 18, 2014, for U.S. Appl. No. 13/559,390, 16 pages.
Chen et al., "Apparatus, Method and Article for Providing Vehicle Diagnostic Data," Notice of Allowance dated Nov. 3, 2014, for U.S. Appl. No. 13/559,390, 10 pages.
Chen et al., "Apparatus, Method and Article for Providing Vehicle Diagnostic Data," U.S. Appl. No. 14/609,201, filed Jan. 29, 2015, 61 pages.
Chen et al., "Apparatus, Method and Article for Providing Vehicle Diagnostic Data," U.S. Appl. No. 61/601,404, filed Feb. 21, 2012, 56 pages.
Chen et al., "Systems and Methods for Powering Electric Vehicles Using a Single or Multiple Power Cells," U.S. Appl. No. 61/862,852, filed Aug. 6, 2013, 46 pages.
Communication pursuant to Rules 161(2) and 162 EPC, for corresponding European Patent Application No. 12817273.1, dated Mar. 25, 2014, 3 pages.
Communication pursuant to Rules 161(2) and 162 EPC, for corresponding European Patent Application No. 12817141.0, dated Mar. 26, 2014, 3 pages.
Communication pursuant to Rules 161(2) and 162 EPC, for corresponding European Patent Application No. 12818308.4, dated Mar. 26, 2014, 3 pages.
Communication pursuant to Rules 161(2) and 162 EPC, for corresponding European Patent Application No. 12817696.3, dated Mar. 27, 2014, 3 pages.
Communication pursuant to Rules 161(2) and 162 EPC, for corresponding European Patent Application No. 12817883.7, dated Mar. 27, 2014, 3 pages.
Communication pursuant to Rules 161(2) and 162 EPC, for corresponding European Patent Application No. 12818447.0, dated Mar. 27, 2014, 3 pages.
Huang et al., "Apparatus, Method and Article for Vehicle Turn Signals," U.S. Appl. No. 61/727,403, filed Nov. 16, 2012, 41 pages.
International Preliminary Report on Patentability and Written Opinion for corresponding International Patent Application No. PCT/US2012/048349, dated Jan. 28, 2014, 5 pages.
International Preliminary Report on Patentability and Written Opinion for corresponding International Patent Application No. PCT/US2012/048354, dated Jan. 28, 2014, 7 pages.
International Preliminary Report on Patentability and Written Opinion for corresponding International Patent Application No. PCT/US2012/048358, dated Jan. 28, 2014, 5 pages.
International Preliminary Report on Patentability and Written Opinion for corresponding International Patent Application No. PCT/US2012/048366, dated Jan. 28, 2014, 5 pages.
International Preliminary Report on Patentability and Written Opinion for corresponding International Patent Application No. PCT/US2012/048367, dated Jan. 28, 2014, 4 pages.
International Preliminary Report on Patentability and Written Opinion for corresponding International Patent Application No. PCT/US2012/048375, dated Jan. 28, 2014, 5 pages.
International Preliminary Report on Patentability and Written Opinion for corresponding International Patent Application No. PCT/US2012/048379, dated Jan. 28, 2014, 5 pages.
International Preliminary Report on Patentability and Written Opinion for corresponding International Patent Application No. PCT/US2012/048380, dated Jan. 28, 2014, 5 pages.
International Preliminary Report on Patentability and Written Opinion for corresponding International Patent Application No. PCT/US2012/048382, dated Jan. 28, 2014, 5 pages.
International Preliminary Report on Patentability and Written Opinion for corresponding International Patent Application No. PCT/US2012/048391, dated Jan. 28, 2014, 6 pages.
International Search Report and Written Opinion for corresponding International Patent Application No. PCT/US2012/048344, dated Feb. 28, 2013, 9 pages.
International Search Report and Written Opinion for corresponding International Patent Application No. PCT/US2012/048347, dated Dec. 18, 2012, 8 pages.
International Search Report and Written Opinion for corresponding International Patent Application No. PCT/US2012/048349, dated Feb. 18, 2013, 9 pages.
International Search Report and Written Opinion for corresponding International Patent Application No. PCT/US2012/048354, dated Feb. 18, 2013, 11 pages.
International Search Report and Written Opinion for corresponding International Patent Application No. PCT/US2012/048366, dated Jan. 21, 2013, 10 pages.
International Search Report and Written Opinion for corresponding International Patent Application No. PCT/US2012/048367, dated Jan. 17, 2013, 8 pages.
International Search Report and Written Opinion for corresponding International Patent Application No. PCT/US2012/048375, dated Jan. 23, 2013, 9 pages.
International Search Report and Written Opinion for corresponding International Patent Application No. PCT/US2012/048379, dated Dec. 17, 2012, 9 pages.

(56) References Cited

OTHER PUBLICATIONS

International Search Report and Written Opinion for corresponding International Patent Application No. PCT/US2012/048380, dated Feb. 27, 2013, 9 pages.
International Search Report and Written Opinion for corresponding International Patent Application No. PCT/US2012/048382, dated Feb. 27, 2013, 9 pages.
International Search Report and Written Opinion for corresponding International Patent Application No. PCT/US2012/063979, dated Mar. 4, 2013, 10 pages.
International Search Report and Written Opinion for corresponding International Application No. PCT/US2012/048391, dated Dec. 21, 2012, 9 pages.
International Search Report and Written Opinion for corresponding International Application No. PCT/US2012/058930, dated Mar. 15, 2013, 11 pages.
International Search Report and Written Opinion for corresponding International Application No. PCT/US2013/070131, dated Feb. 19, 2014, 17 pages.
International Search Report and Written Opinion for corresponding International Application No. PCT/US2013/065704, dated Feb. 13, 2014, 13 pages.
International Search Report and Written Opinion for corresponding International Patent Application No. PCT/US2012/048358, dated Feb. 25, 2013, 9 pages.
International Search Report and Written Opinion for corresponding International Application No. PCT/US2012/059931, dated Mar. 29, 2013, 13 pages.
International Search Report and Written Opinion, for corresponding International Application No. PCT/US2014/021369, dated Jul. 2, 2014, 14 pages.
International Search Report and Written Opinion, for corresponding International Application No. PCT/US2014/022610, dated Jul. 10, 2014, 12 pages.
International Search Report and Written Opinion for corresponding International Application No. PCT/US2014/024757, dated Jul. 11, 2014, 15 pages.
International Search Report and Written Opinion for corresponding International Application No. PCT/US2014/023539, dated Sep. 4, 2014, 12 pages.
International Search Report and Written Opinion dated Nov. 18, 2014, for corresponding International Application No. PCT/US2014/050000, 11 pages.
International Search Report and Written Opinion for corresponding International Application No. PCT/US2014/050001, dated Nov. 18, 2014, 9 pages.
International Search Report and Written Opinion for corresponding International Application No. PCT/US2015/012222, dated Apr. 24, 2015, 12 pages.
Japanese Office Action with English Translation, dated Dec. 16, 2014, for corresponding JP Application No. 2014-523013, 11 pages.
English Translation of Japanese Office Action dated Feb. 17, 2015, for corresponding Japanese Patent Application No. 2014-523007, 7 pages.
Luke et al., "Portable Electrical Energy Storage Device," U.S. Appl. No. 61/872,126, filed Aug. 30, 2013, 39 pages.
Luke et al., "Apparatus, Method and Article for Authentication, Security and Control of Portable Charging Devices and Power Storage Devices, Such as Batteries," Office Action dated Jan. 6, 2014, for U.S. Appl. No. 14/017,090, 19 pages.
Luke et al., "Apparatus, Method and Article for Authentication, Security and Control of Portable Charging Devices and Power Storage Devices, Such as Batteries," Office Action dated Jun. 26, 2014, for U.S. Appl. No. 14/017,090, 19 pages.
Luke et al., "Apparatus, Method and Article for Authentication, Security and Control of Portable Charging Devices and Power Storage Devices, Such as Batteries," U.S. Appl. No. 61/773,621, filed Mar. 6, 2013, 69 pages.
Luke et al., "Apparatus, Method and Article for Providing Targeted Advertising in a Rechargeable Electrical Power Storage Device Distribution Environment," U.S. Appl. No. 61/773,614, filed Mar. 6, 2013, 77 pages.
Luke et al., "Detectible Indication of an Electric Motor Vehicle Standby Mode," Office Action for U.S. Appl. No. 13/646,320, dated May 30, 2013, 13 pages.
Luke et al., "Detectible Indication of an Electric Motor Vehicle Standby Mode," Notice of Allowance for U.S. Appl. No. 13/646,320, dated Apr. 10, 2014, 8 pages.
Luke et al., "Detectible Indication of an Electric Motor Vehicle Standby Mode," U.S. Appl. No. 61/543,720, filed Oct. 5, 2011, 35 pages.
Luke et al., "Detectible Indication of an Electric Motor Vehicle Standby Mode," U.S. Appl. No. 61/684,432, filed Aug. 17, 2012, 41 pages.
Luke et al., "Drive Assembly for Electric Powered Device," U.S. Appl. No. 61/546,411, filed Oct. 12, 2011, 18 pages.
Luke et al., "Electric Device Drive Assembly and Cooling System," U.S. Appl. No. 61/615,144, filed Mar. 23, 2012, 43 pages.
Luke et al., "Modular System for Collection and Distribution of Electric Storage Devices," U.S. Appl. No. 61/789,065, filed Mar. 15, 2013, 76 pages.
Luke et al., "Apparatus, Method and Article for Authentication, Security and Control of Power Storage Devices, Such as Batteries, Based on User Profiles," U.S. Appl. No. 61/534,772, filed Sep. 14, 2011, 55 pages.
Luke et al., "Apparatus, Method and Article for Authentication, Security and Control of Power Storage Devices, Such as Batteries," Office Action dated Feb. 26, 2014, for U.S. Appl. No. 13/559,038, 13 pages.
Luke et al., "Apparatus, Method and Article for Authentication, Security and Control of Power Storage Devices, Such as Batteries," Office Action dated Aug. 19, 2014, for U.S. Appl. No. 13/559,038, 14 pages.
Luke et al., "Apparatus, Method and Article for Authentication, Security and Control of Power Storage Devices, Such as Batteries," Office Action dated Feb. 25, 2014, for U.S. Appl. No. 14/023,344, 12 pages.
Luke et al., "Apparatus, Method and Article for Authentication, Security and Control of Power Storage Devices, Such as Batteries," Office Action dated Aug. 21, 2014, for U.S. Appl. No. 14/023,344, 13 pages.
Luke et al., "Apparatus, Method and Article for Authentication, Security and Control of Power Storage Devices, Such as Batteries," U.S. Appl. No. 61/534,761, filed Sep. 14, 2011, 55 pages.
Luke et al., "Apparatus, Method and Article for Collection, Charging and Distributing Power Storage Devices, Such as Batteries," U.S. Appl. No. 61/511,900, filed Jul. 26, 2011, 73 pages.
Luke et al., "Apparatus, Method and Article for Collection, Charging and Distributing Power Storage Devices, Such as Batteries," U.S. Appl. No. 61/647,936, filed May 16, 2012, 76 pages.
Luke et al., "Apparatus, Method and Article for Redistributing Power Storage Devices, Such as Batteries, Between Collection, Charging and Distribution Machines," U.S. Appl. No. 61/534,753, filed Sep. 14, 2011, 65 pages.
Luke et al., "Dynamically Limiting Vehicle Operation for Best Effort Economy," Office Action for U.S. Appl. No. 13/559,264, dated Aug. 14, 2013, 21 pages.
Luke et al., "Dynamically Limiting Vehicle Operation for Best Effort Economy," Office Action for U.S. Appl. No. 13/559,264, dated Feb. 12, 2014, 24 pages.
Luke et al., "Dynamically Limiting Vehicle Operation for Best Effort Economy," Office Action for U.S. Appl. No. 13/559,264, dated Aug. 19, 2014, 26 pages.
Luke et al., "Dynamically Limiting Vehicle Operation for Best Effort Economy," Office Action for U.S. Appl. No. 13/559,264, dated Jan. 21, 2015, 31 pages.
Luke et al., "Dynamically Limiting Vehicle Operation for Best Effort Economy," U.S. Appl. No. 61/511,880, filed Jul. 26, 2011, 52 pages.

(56) References Cited

OTHER PUBLICATIONS

Luke et al., "Thermal Management of Components in Electric Motor Drive Vehicles," Office Action dated Apr. 2, 2014, for U.S. Appl. No. 13/559,259, 11 pages.
Luke et al., "Thermal Management of Components in Electric Motor Drive Vehicles," Notice of Allowance dated Jul. 28, 2014, for U.S. Appl. No. 13/559,259, 7 pages.
Luke et al., "Thermal Management of Components in Electric Motor Drive Vehicles," U.S. Appl. No. 61/511,887, filed Jul. 26, 2011, 44 pages.
Luke et al., "Thermal Management of Components in Electric Motor Drive Vehicles," U.S. Appl. No. 61/647,941, filed May 16, 2012, 47 pages.
Luke, "Apparatus, Method and Article for Changing Portable Electrical Power Storage Device Exchange Plans," U.S. Appl. No. 61/778,038, filed Mar. 12, 2013, 56 pages.
Luke, "Apparatus, Method and Article for Providing Information Regarding a Vehicle via a Mobile Device," Office Action for U.S. Appl. No. 14/017,081, dated Jan. 30, 2014, 36 pages.
Luke, "Apparatus, Method and Article for Providing Information Regarding a Vehicle via a Mobile Device," Office Action for U.S. Appl. No. 14/017,081, dated Jul. 21, 2014, 42 pages.
Luke, "Apparatus, Method and Article for Providing Information Regarding a Vehicle via a Mobile Device," Office Action for U.S. Appl. No. 14/017,081, dated Dec. 31, 2014, 59 pages.
Luke, "Apparatus, Method and Article for Providing Information Regarding a Vehicle via a Mobile Device," U.S. Appl. No. 61/780,781, filed Mar. 13, 2013, 80 pages.
Microchip, "AN885: Brushless DC (BLDC) Motor Fundamentals," Microchip Technology Inc., 2003, 19 pages.
Park, "A Comprehensive Thermal Management System Model for Hybrid Electric Vehicles," dissertation, The University of Michigan, 2011, 142 pages.
Taylor et al., "Apparatus, Method and Article for Physical Security of Power Storage Devices in Vehicles," Notice of Allowance for U.S. Appl. No. 13/559,054, dated May 30, 2013, 32 pages.
Taylor et al., "Apparatus, Method and Article for Physical Security of Power Storage Devices in Vehicles," Office Action for U.S. Appl. No. 13/559,054, dated Dec. 3, 2012, 11 pages.
Taylor et al., "Apparatus, Method and Article for Physical Security of Power Storage Devices in Vehicles," Office Action dated Dec. 10, 2014, for U.S. Appl. No. 14/012,845, 13 pages.
Taylor et al., "Apparatus, Method and Article for Physical Security of Power Storage Devices in Vehicles," U.S. Appl. No. 61/557,170, filed Nov. 8, 2011, 60 pages.
Taylor et al., "Apparatus, Method and Article for Providing Vehicle Event Data," U.S. Appl. No. 61/901,660, filed Nov. 8, 2013, 58 pages.
Wu et al., "Apparatus, Method and Article for Security of Vehicles," Office Action dated Oct. 2, 2014, for U.S. Appl. No. 13/671,144, 20 pages.
Wu et al., "Battery Configuration for an Electric Vehicle," U.S. Appl. No. 61/716,388, filed Oct. 19, 2012, 37 pages.
Wu et al., "Apparatus, Method and Article for a Power Storage Device Compartment," Office Action for U.S. Appl. No. 13/559,125, dated Feb. 24, 2014, 28 pages.
Wu et al., "Apparatus, Method and Article for a Power Storage Device Compartment," Office Action for U.S. Appl. No. 13/559,125, dated Sep. 9, 2014, 28 pages.
Wu et al., "Apparatus, Method and Article for a Power Storage Device Compartment," U.S. Appl. No. 61/581,566, filed Dec. 29, 2011, 61 pages.
Wu et al., "Apparatus, Method and Article for Providing Information Regarding Availability of Power Storage Devices at a Power Storage Device Collection, Charging and Distribution Machine," Office Action dated Mar. 5, 2014, for U.S. Appl. No. 14/022,140, 8 pages.
Wu et al., "Apparatus, Method and Article for Providing to a User Device Information Regarding Availability of Portable Electrical Energy Storage Devices at a Portable Electrical Energy Storage Device Collection, Charging and Distribution Machine," Notice of Allowance dated Jun. 30, 2014, for U.S. Appl. No. 14/022,140, 5 pages.
Wu et al., "Apparatus, Method and Article for Providing to a User Device Information Regarding Availability of Portable Electrical Energy Storage Devices at a Portable Electrical Storage Device Collection, Charging and Distribution Machine," U.S. Appl. No. 14/511,137, filed Oct. 9, 2014, 56 pages.
Wu et al., "Apparatus, Method and Article for Providing Information Regarding Availability of Power Storage Devices at a Power Storage Device Collection, Charging and Distribution Machine," U.S. Appl. No. 61/601,953, filed Feb. 22, 2012, 53 pages.
Wu et al., "Apparatus, Method and Article for Providing Locations of Power Storage Device Collection, Charging and Distribution Machines," Office Action for U.S. Appl. No. 13/559,333, dated Jul. 3, 2013, 14 pages.
Wu et al., "Apparatus, Method and Article for Providing Locations of Power Storage Device Collection, Charging and Distribution Machines," Office Action dated Nov. 27, 2013, for U.S. Appl. No. 13/559,333, 19 pages.
Wu et al., "Apparatus, Method and Article for Providing Locations of Power Storage Device Collection, Charging and Distribution Machines," Notice of Allowance dated Jul. 10, 2014, for U.S. Appl. No. 13/559,333, 9 pages.
Wu et al., "Apparatus, Method and Article for Providing Locations of Power Storage Device Collection, Charging and Distribution Machines," Office Action dated Nov. 19, 2013, for U.S. Appl. No. 14/022,147, 10 pages.
Wu et al., "Apparatus, Method and Article for Providing Locations of Power Storage Device Collection, Charging and Distribution Machines," Office Action dated Mar. 5, 2014, for U.S. Appl. No. 14/022,147, 12 pages.
Wu et al., "Apparatus, Method and Article for Providing Locations of Power Storage Device Collection, Charging and Distribution Machines," Office Action dated Aug. 6, 2014, for U.S. Appl. No. 14/022,147, 17 pages.
Wu et al., "Apparatus, Method and Article for Providing Locations of Power Storage Device Collection, Charging and Distribution Machines," Notice of Allowance dated Nov. 25, 2014, for U.S. Appl. No. 14/022,147, 5 pages.
Wu et al., "Apparatus, Method and Article for Providing Locations of Power Storage Device Collection, Charging and Distribution Machines," U.S. Appl. No. 61/601,949, filed Feb. 22, 2012, 56 pages.
Wu et al., "Apparatus, Method and Article for Security of Vehicles," U.S. Appl. No. 61/557,176, filed Nov. 8, 2011, 37 pages.
Wu et al., "Apparatus, Method and Article for Power Storage Device Failure Safety," U.S. Appl. No. 14/071,134, filed Nov. 4, 2013, 68 pages.
Wu et al., "Apparatus, Method and Article for Power Storage Device Failure Safety," Office Action for U.S. Appl. No. 14/071,134, dated Feb. 12, 2014, 14 pages.
Wu et al., "Apparatus, Method and Article for Power Storage Device Failure Safety," Office Action dated Jun. 9, 2014, for U.S. Appl. No. 14/071,134, 15 pages.

* cited by examiner

| Category | Storage Devices | Status | | Depletion Plan | |
|---|---|---|---|---|---|
| A | | Currently Being Depleted | | Deplete First | |
| | 106a | 30% of original capacity | | Deplete together with others in same category | |
| | 106b | 30% of original capacity | | Deplete together with others in same category | |
| | 106e | 30% of original capacity | | Deplete together with others in same category | |
| B | | Not Currently Being Depleted | | Deplete Second | |
| | 106d | 40% of original capacity | | Deplete together with others in same category | |
| | 106f | 40% of original capacity | | Deplete together with others in same category | |
| C | | Not Currently Being Depleted | | Deplete Third | |
| | 106g | 50% of original capacity | | Deplete together with others in same category | |
| | 106h | 50% of original capacity | | Deplete together with others in same category | |
| | 106i | 50% of original capacity | | Deplete together with others in same category | |
| D | | Not Currently Being Depleted | | Deplete Fourth | |
| | 106j | 60% of original capacity | | Deplete by itself | |
| Failed | | Disconnected/Isolated | | Disconnect/Isolate | |
| | 106c | Failed | | Disconnect/Isolate | |

*FIG. 3B*

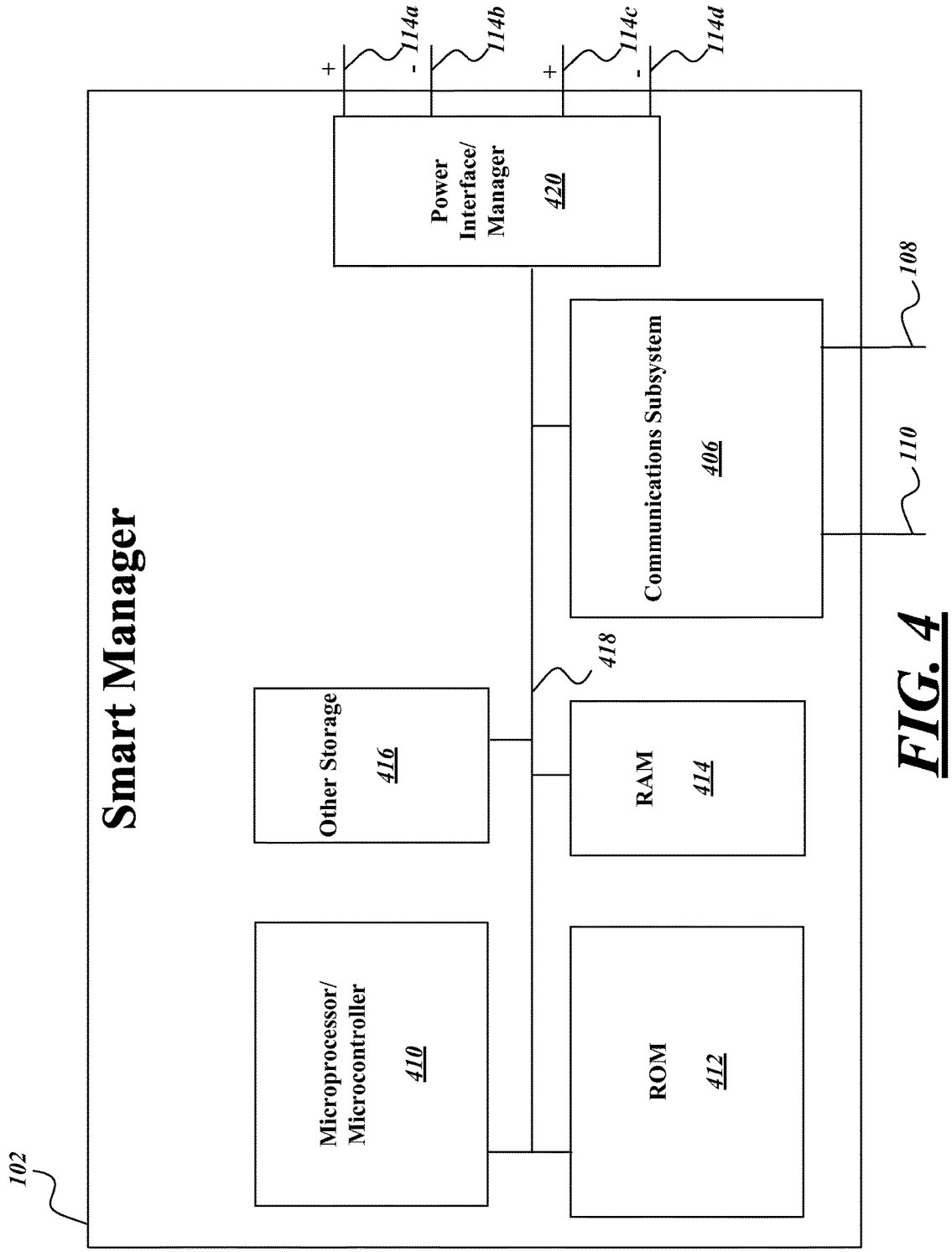

SYSTEMS AND METHODS FOR UTILIZING AN ARRAY OF POWER STORAGE DEVICES, SUCH AS BATTERIES

BACKGROUND

Technical Field

The present disclosure generally relates to the charging and energy release from rechargeable electrical energy storage devices (e.g., secondary batteries, supercapacitors or ultracapacitors), which may be suitable for use in a variety of fields or applications, for instance transportation and non-transportation uses.

Description of the Related Art

There are a wide variety of uses or applications for electrical energy storage devices. One such application is in the field of transportation. However, after rechargeable electrical energy storage devices used in transportation applications no longer have the required capacity to continue to be used in such transportation applications, other uses of these electrical energy storage devices may need to be found in order to utilize the remaining capacity. Thus a need exists to utilize these aged electrical energy storage devices efficiently and in a more cost-effective manner.

Additionally, increasing numbers of rechargeable lithium-ion (Li-ion) batteries are starting to be used in new electric vehicles. However, since lithium-ion battery-powered cars are relatively recently coming to the mass market, the recycling centers that can reclaim their components are still in their infancy too. Also, Recycled lithium is as much as five times the cost of lithium produced from the least costly brine based process. In particular, with lithium recycling in its infancy, there is currently no main recycling infrastructure in the world that treats only automotive Li-ion batteries. Therefore, given the current limit to the extent of battery-recycling infrastructure for these types of recycling centers and the fact that lithium-based batteries are less valuable to recycle than earlier types of batteries, there is also a current need, especially with respect to lithium-ion batteries, to find more ways to utilize the remaining capacity for these types of batteries before incurring the cost and going through the effort of recycling them.

BRIEF SUMMARY

A system for utilizing an array of electrical energy storage devices may be summarized as including at least one controller; and at least one communications module coupled to the at least one controller, wherein the at least one controller is configured to: cause the at least one communications module to receive information regarding status of each of a plurality of electrical energy storage devices of the array of electrical energy storage devices; make a determination regarding from which of the plurality of electrical energy storage devices to allow power to be drawn and when to allow power to be drawn from particular electrical energy storage devices of the plurality of electrical energy storage devices, based on the received information regarding status of each of the plurality of electrical energy storage devices; and cause power to be drawn from the particular electrical energy storage devices of the plurality of electrical energy storage devices according to the determination. The information regarding status may include information regarding one or more of: indications whether one or more of the plurality of electrical energy storage devices is faulty; amount of remaining capacity of original electrical energy storage device capacity of each of the plurality of electrical energy storage devices; an age of each of the plurality of electrical energy storage devices; remaining life expectancy of each of the plurality of electrical energy storage devices; present electrical resistance of each of the plurality of electrical energy storage devices; current load contribution of each of the plurality of electrical energy storage devices; usage history of one or more of the electrical energy storage devices; appearance of a short on a circuit to which one or more of the plurality of electrical energy storage devices is connected; status of a circuit to which one or more of the plurality of electrical energy storage devices is connected; temperature of a circuit to which one or more of the plurality of electrical energy storage devices is connected; whether one or more of the plurality of electrical energy storage devices are presently connected in parallel or series with one or more other electrical energy storage devices of the plurality of electrical energy storage devices; a number of charge cycles that has occurred for each of one or more of the plurality of electrical energy storage devices; a number of expected remaining charge cycles available for each of one or more of the plurality of electrical energy storage devices; present charge level of one or more of the plurality of electrical energy storage devices; present charge level of one or more groups of electrical energy storage devices of the plurality of electrical energy storage devices; present charge capacity of one or more of the plurality of electrical energy storage devices; present charge level of one or more groups of electrical energy storage devices of the plurality of electrical energy storage devices; present operating voltage of one or more of the plurality of electrical energy storage devices; present operating voltage of one or more groups of electrical energy storage devices of the plurality of electrical energy storage devices; production tolerances of one or more of the plurality of electrical energy storage devices; temperature of one or more of the plurality of electrical energy storage devices; temperature distribution across two or more of the plurality of electrical energy storage devices; temperature distribution across one or more groups of electrical energy storage devices of the plurality of electrical energy storage devices; one or more ageing characteristics of one or more of the plurality of electrical energy storage devices; strength of one or more of the plurality of electrical energy storage devices; indications of a likelihood of failure of one or more of the plurality of electrical energy storage devices; one or more types of electrical energy storage devices of the plurality of electrical energy storage devices; a manufacturing batch of one or more of the plurality of electrical energy storage devices; charging time for one or more of the plurality of electrical energy storage devices; reliability of one or more of the plurality of electrical energy storage devices; past performance of one or more of the plurality of electrical energy storage devices; whether one or more of the plurality of electrical energy storage devices matches characteristics of one or more other electrical energy storage devices of the plurality of electrical energy storage devices; whether one or more of the plurality of electrical energy storage devices matches age characteristics of one or more other electrical energy storage devices of the plurality of electrical energy storage devices; whether one or more of the plurality of electrical energy storage devices matches remaining life expectancy characteristics of one or more other electrical energy storage devices of the plurality of electrical energy storage devices; whether one or more of the plurality of electrical energy storage devices matches electrical resistance characteristics of one or more other electrical energy storage devices of the plurality of electrical energy storage devices; and whether one or more of the plurality of electrical energy storage devices has been disconnected from a circuit to which others of the plurality of electrical energy storage devices are connected. The at least one controller may be configured to make the determination regarding from which of the plurality of electrical energy storage devices to allow power to be drawn by at least being configured to: determine that an electrical energy storage device of the plurality of electrical energy storage devices is faulty based on the received information regarding status of each of the plurality of electrical energy storage devices; in response to the determination that the electrical energy storage device is faulty, determine to prevent power from being drawn from the electrical energy storage device determined to be faulty.

The system wherein the at least one controller may be further configured to: prevent power to be drawn from the electrical energy storage device determined to be faulty by being configured to disconnect the electrical energy storage device determined to be faulty from an electrical circuit to which others of the plurality of electrical energy storage devices are connected in the array.

The system wherein the at least one controller may be further configured to: send a signal to initiate a replacement to be made, in the array of electrical energy storage devices, of the electrical energy storage device determined to be faulty. The at least one controller may be configured to make the determination regarding from which of the plurality of electrical energy storage devices to allow power to be drawn and when to allow power to be drawn from particular electrical energy storage devices of the plurality of electrical energy storage devices by at least being configured to: categorize, based on the received information regarding status, electrical energy storage devices of the plurality of electrical energy storage devices into categories based on matching characteristics regarding one or more of: electrical energy storage device age, present electrical resistance, amount of remaining capacity of original electrical energy storage device capacity, and life expectancy, of various electrical energy storage devices of the plurality of electrical energy storage devices; for each particular category of the categories into which the electrical energy storage devices of the plurality of electrical energy storage devices were categorized, enable concurrent depletion of charge of each electrical energy storage device in the particular category with each other electrical energy storage device in the particular category; and determine a depletion plan which indicates an order in which a depletion of charge will occur sequentially for each particular category of electrical energy storage device with respect to each other particular category. The at least one controller may be configured to categorize, based on the received information regarding status, electrical energy storage devices of the plurality of electrical energy storage devices into the categories by at least being configured to: categorize electrical energy storage devices that have similar characteristics regarding one or more of: electrical energy storage device age, present electrical resistance, amount of remaining capacity of original electrical energy storage device capacity, and life expectancy into a same particular category.

The at least one controller may be configured to make the determination regarding from which of the plurality of electrical energy storage devices to allow power to be drawn and when to allow power to be drawn from particular electrical energy storage devices of the plurality of electrical energy storage devices by at least being further configured to: determine a depletion plan which indicates a depletion sequence in which a depletion of charge will occur sequentially for each particular category of electrical energy storage device with respect to each other particular category.

The at least one controller may be configured to cause power to be drawn from the particular electrical energy storage devices of the plurality of electrical energy storage devices according to the determination regarding from which of the plurality of electrical energy storage devices to allow power to be drawn and when to allow power to be drawn from particular electrical energy storage devices of the plurality of electrical energy storage devices by at least being configured to: cause power to be drawn from the particular electrical energy storage devices according to the determined depletion plan. The at least one controller may be configured to cause power to be drawn from the particular electrical energy storage devices according to the determined depletion plan by at least being configured to: for each particular category of the categories, cause each electrical energy storage device in the particular category to be electrically connected in parallel with respect to each other electrical energy storage device in the particular category to allow power to be drawn concurrently from each electrical energy storage device in the particular category when connected to an electrical circuit of the array.

The at least one controller may be configured to cause power to be drawn from the particular electrical energy storage devices according to the determined depletion plan by at least being further configured to: cause each electrical energy storage device in a first particular category in the sequence to be electrically connected to an electrical circuit of the array to allow power to be drawn from each electrical energy storage device in the first particular category; after the connection of each electrical energy storage device in the first particular category, cause each electrical energy storage device in the first particular category to be electrically disconnected from the electrical circuit of the array to prevent further power from being able to be drawn from each electrical energy storage device in the first particular category based on detection of a minimum present charge level being reached associated with the first particular category of electrical energy storage devices; and after the disconnection of each electrical energy storage device in the first particular category, cause each electrical energy storage device in a subsequent particular category in the sequence to be electrically connected to the electrical circuit of the array to allow power to be drawn from each electrical energy storage device in the subsequent particular category; after the connection of each electrical energy storage device in the subsequent particular category, cause each electrical energy storage device in the subsequent particular category to be electrically disconnected from the electrical circuit of the array to prevent further power from being able to be drawn from each electrical energy storage device in the subsequent particular category based on detection of a minimum present charge level being reached associated with the subsequent particular category of electrical energy storage devices; and after the disconnection of each electrical energy storage device in the subsequent particular category, repeat, for each additional subsequent particular category in the sequence, in an order indicated by the sequence, the causation of electrical connection to the electrical circuit of the array and the causation of the electrical disconnection from the electrical circuit of the array in sequence according to the depletion plan.

The at least one controller may be further configured to forecast actual electrical energy capacity of the array based on the received information regarding status of each of the plurality of electrical energy storage devices of the array and on the enablement of power to be drawn from the particular electrical energy storage devices according to the determined depletion plan.

The system may further include the array of electrical energy storage devices operably connected to the at least one controller. The array of electrical energy storage devices may be operably connected to the at least one controller via a communications link to the at least one communications module and via an electrical circuit of the array.

A method in a system for utilizing an array of electrical energy storage devices may be summarized as including receiving, by a communications module of the system for utilizing an array of electrical energy storage devices, information regarding status of each of a plurality of electrical energy storage devices of the array of electrical energy storage devices; determining, by a controller of the system for utilizing an array of electrical energy storage devices, regarding from which of the plurality of electrical energy storage devices to allow power to be drawn and when to allow power to be drawn from particular electrical energy storage devices of the plurality of electrical energy storage devices, based on the received information regarding status of each of the plurality of electrical energy storage devices; and causing, by the controller of the system for utilizing an array of electrical energy storage devices, power to be drawn from the particular electrical energy storage devices of the plurality of electrical energy storage devices according to the determination. The determining may include determining that an electrical energy storage device of the plurality of electrical energy storage devices is faulty based on the received information regarding status of each of the plurality of electrical energy storage devices; and in response to the determination that the electrical energy storage device is faulty, preventing power from being drawn from the electrical energy storage device determined to be faulty.

The method may further include sending, by the communications module of the system for utilizing an array of electrical energy storage devices, a signal to initiate a replacement to be made, in the array of electrical energy storage devices, of the electrical energy storage device determined to be faulty. The determining may include categorizing, based on the received information regarding status, electrical energy storage devices of the plurality of electrical energy storage devices into categories based on matching characteristics regarding one or more of: electrical energy storage device age, present electrical resistance, amount of remaining capacity of original electrical energy storage device capacity, and life expectancy, of various electrical energy storage devices of the plurality of electrical energy storage devices; for each particular category of the categories into which the electrical energy storage devices of the plurality of electrical energy storage devices were categorized, enabling concurrent depletion of charge of each electrical energy storage device in the particular category with each other electrical energy storage device in the particular category; and determining a depletion plan which indicates an order in which a depletion of charge will occur sequentially for each particular category of electrical energy storage device with respect to each other particular category.

The categorizing may include categorizing electrical energy storage devices that have similar characteristics regarding one or more of: electrical energy storage device age, present electrical resistance, amount of remaining capacity of original electrical energy storage device capacity, and life expectancy into a same particular category.

A non-transitory computer readable storage medium may be summarized as including computer executable instructions thereon that, when executed cause a processor of a system for utilizing an array of electrical energy storage devices to: receive information regarding status of each of a plurality of electrical energy storage devices of the array of electrical energy storage devices; and make a determination regarding when to allow power to be drawn from each particular electrical energy storage device of the plurality of electrical energy storage devices, based on the received information regarding status of each of the plurality of electrical energy storage devices; and cause power to be drawn from the particular electrical energy storage devices of the plurality of electrical energy storage devices according to the determination.

Making the determination regarding when to allow power to be drawn from each particular electrical energy storage device of the plurality of electrical energy storage devices may include categorizing electrical energy storage devices that have similar characteristics regarding one or more of: electrical energy storage device age, present electrical resistance, amount of remaining capacity of original electrical energy storage device capacity, and life expectancy into a same particular category of electrical energy storage devices of a plurality of categories of electrical energy storage devices; and determining a depletion plan which indicates a depletion sequence in which a depletion of charge will occur sequentially for each particular category of the plurality of categories with respect to each other particular category of the plurality of categories. One or more of the plurality of electrical energy storage devices of the array may be portable electrical energy storage devices. One or more of the plurality of electrical energy storage devices of the array are used portable electrical energy storage devices previously used to power an electric vehicle, and the array of electrical energy storage devices may be a back-up power supply for a building. The plurality of electrical energy storage devices of the array may be individual cells and the array may include a battery. Each electrical energy storage device of the plurality of electrical energy storage devices of the array may be a battery pack.

An electrical energy storage device may be summarized as including at least one controller; and at least one communications module coupled to the at least one controller, wherein the at least one controller is configured to: cause the at least one communications module to send information regarding status of the electrical energy storage device to a system for utilizing an array of electrical energy storage devices including the electrical energy storage device; make a determination regarding whether the electrical energy storage device is faulty; and cause the electrical energy storage device to be disconnected from an electrical circuit of the array of electrical energy storage devices if a determination is made by the at least one controller that the electrical energy storage device is faulty.

The at least one controller may be further configured to: receive information regarding present status of one or more other electrical energy storage devices in the array; make a determination regarding whether to allow power to be drawn from the electrical energy storage device via the electrical circuit of the array based on the received information regarding present status of the one or more other electrical energy storage devices in the array and based on enablement of concurrent depletion of charge of each electrical energy storage device in a particular category with each other electrical energy storage device in the particular category; and cause power to be drawn from the electrical energy storage device according to the determination by causing the electrical energy storage device to be connected to the electrical circuit of the array of electrical energy storage devices in response to a determination to allow power to be drawn from the electrical energy storage device.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIG. 3B is a table showing a depletion plan determined by the system for utilizing an array of electrical energy storage devices of FIG. 3A based on to the categorizations of the electrical energy storage devices in the array, according to one non-limiting illustrated embodiment.

FIG. 4 is a schematic view of the smart manager of the system for utilizing an array of electrical energy storage devices shown in FIG. 1 through FIG. 3B, according to one non-limiting illustrated embodiment.

DETAILED DESCRIPTION

Figure 1:
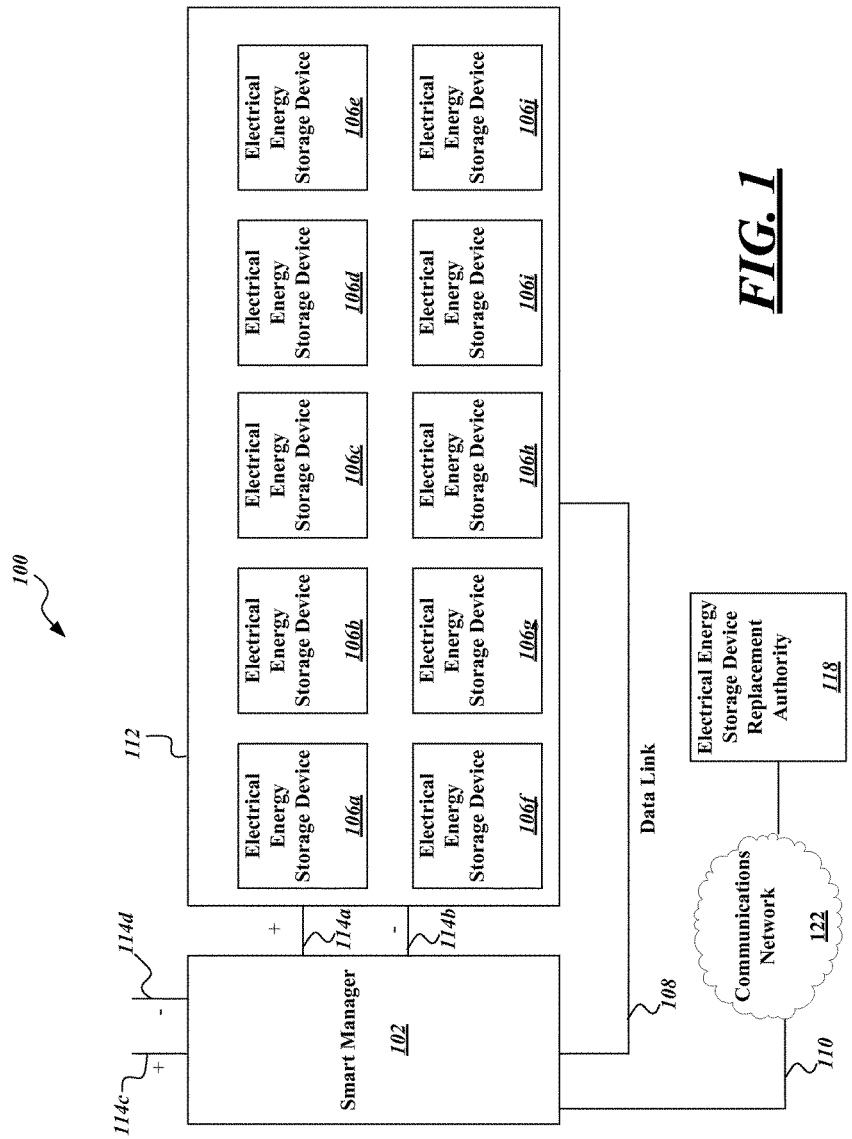
FIG. 1 is a schematic view of a system for utilizing an array of electrical energy storage devices, according to one non-limiting illustrated embodiment.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with batteries, supercapacitors or ultracapacitors, power converters including but not limited to transformers, rectifiers, DC/DC power converters, switch mode power converters, controllers, and communications systems and structures and networks have not been shown or described in detail to avoid unnecessarily obscuring descriptions of the embodiments.

Unless the context requires otherwise, throughout the specification and claims which follow, the word "comprise" and variations thereof, such as "comprises" and "comprising," are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment.

The use of ordinals such as first, second and third does not necessarily imply a ranked sense of order, but rather may only distinguish between multiple instances of an act or structure.

The headings and Abstract of the Disclosure provided herein are for convenience only and do not interpret the scope or meaning of the embodiments.

Reference herein to electrical energy storage device means any device capable of storing electrical power and releasing stored electrical power including but not limited to cells, batteries, supercapacitors or ultracapacitors. For example, a cell is an electrical energy storage device in which chemical energy is converted into electricity and used as a source of power. A battery is a container including one or more cells. In particular, reference to batteries herein means chemical storage cell or cells, for instance, rechargeable or secondary cells including but not limited to nickel cadmium alloy or lithium-ion cells. A battery pack, as used herein, refers to a plurality of electrically connected cells. As one example, a battery pack may have 120 cells, but the number of cells may vary in different embodiments. The organization of cells in the battery pack is referred to herein as an array of cells. Battery packs may also be electrically connected together into what is referred to herein as an array of battery packs, or a battery pack array.

Typically, when an array of battery packs is used as a backup power source, many battery packs are paralleled together in an array to provide the needed capacity for backup. When battery packs are paralleled, as long as the series resistance of all the battery packs is similar, the battery packs will normally self-balance. That is, stronger cells will help weaker cells, and the total capacity of an array of battery packs may be looked at as the sum of all capacities of the battery packs in the array. If a battery pack is very aged, however, its internal resistance can be substantially higher than a new battery pack. This can result in excessive heating and uneven load contribution. If a battery pack fails, it can also appear suddenly as a short. The neighboring battery packs in the array will then dump their energy into this shorted battery pack with undesirable results. Massively paralleled arrays of battery packs have a failure rate that is proportional to the number of paralleled battery packs in the array. In other words, an array of 10 battery packs fails twice as often as an array of 5 battery packs. This similarly applies to arrays of battery packs. Described herein is a system for utilizing an array of battery packs in which groups of smart battery packs can isolate themselves from an array of paralleled battery packs and groups of paralleled battery packs can be depleted concurrently separate from other groups of paralleled battery packs in the array. These paralleled battery packs might be part of a larger array of battery packs also.

While paralleled battery packs can readily scale to deliver large capacities, there are times when it can be helpful to serialize the packs. For example, generating AC power that mimics the power coming out of a wall outlet may include use of a transformer or other magnetics if the overall pack voltage is low. For lower-power applications, this isn't a problem. However, for higher power applications, the size and weight of the magnetics can become prohibitive to the implementation of such a system. In this case, it can be beneficial to create a higher DC voltage by serializing battery packs, and then modulating a switching device to approximate the AC voltage. In the case of battery packs being discharged or charged in parallel, the balance becomes even more critical.

For example, FIG. 1 is a schematic view of system 100 for utilizing an array of electrical energy storage devices, which may each be individual battery packs or may alternatively be individual cells, according to one non-limiting illustrated embodiment.

Shown in the system 100 are electrical energy storage devices 106a to 106j arranged in an array 112. The electrical energy storage devices 106a to 106j in the array 112 are electrically connected to each other in a circuit, the types of connections of which may be controlled by smart manager 102. For example, smart manager 102 may change the type of circuit connection (e.g., parallel or serial) between any two or more of the electrical energy storage devices 106a to 106j in the array. Smart manager 102 is electrically connected to the circuit of the array 112 by positive electrical circuit line 114a and negative electrical circuit line 114b. Smart manager also has electrical circuit line 114c representing a positive terminal of the array 112 and electrical circuit line 114d representing a negative terminal of the array 112 to which one or more devices to be powered by the array 112 may be electrically connected to draw power from one or more electrical energy storage devices 106a to 106j in the array 112.

Smart manager 102 is also communicatively connected to the array 112 by data link 108. For example, each of the electrical energy storage devices 106a to 106j may provide information via data link 108 regarding the particular electrical energy storage device over data link 108 to the smart manager 102. In some embodiments, each of the electrical energy storage devices 106a to 106j has a data storage and communication module and coupled processor (not shown) that enables such communication. Such information may be communicated over data link 108 using any applicable data communication protocol for providing such data. For example, the data link 108 may be a wired or wireless point-to-point or client-server data communications link.

Such information communicated over data link 108 may include information regarding status of one or more of the electrical energy storage devices 106a to 106j or groups of electrical energy storage devices within the array 112. The information regarding status may include, but is not limited to information regarding one or more of: indications whether one or more of the plurality of electrical energy storage devices 106a to 106j is faulty; amount of remaining capacity of original electrical energy storage device capacity of each of the plurality of electrical energy storage devices 106a to 106j; an age of each of the plurality of electrical energy storage devices 106a to 106j; remaining life expectancy of each of the plurality of electrical energy storage devices 106a to 106j; present electrical resistance of each of the plurality of electrical energy storage devices 106a to 106j; current load contribution of each of the plurality of electrical energy storage devices 106a to 106j; usage history of one or more of the electrical energy storage devices 106a to 106j; appearance of a short on a circuit to which one or more of the plurality of electrical energy storage devices 106a to 106j is connected; status of a circuit to which one or more of the plurality of electrical energy storage devices 106a to 106j is connected; temperature of a circuit to which one or more of the plurality of electrical energy storage devices 106a to 106j is connected; whether one or more of the plurality of electrical energy storage devices 106a to 106j are presently connected in parallel or series with one or more other electrical energy storage devices of the plurality of electrical energy storage devices 106a to 106j; a number of charge cycles that has occurred for each of one or more of the plurality of electrical energy storage devices 106a to 106j; a number of expected remaining charge cycles available for each of one or more of the plurality of electrical energy storage devices 106a to 106j; present charge level of one or more of the plurality of electrical energy storage devices 106a to 106j; present charge level of one or more groups of electrical energy storage devices of the plurality of electrical energy storage devices 106a to 106j; present charge capacity of one or more of the plurality of electrical energy storage devices 106a to 106j; present charge level of one or more groups of electrical energy storage devices of the plurality of electrical energy storage devices 106a to 106j; present operating voltage of one or more of the plurality of electrical energy storage devices 106a to 106j; present operating voltage of one or more groups of electrical energy storage devices of the plurality of electrical energy storage devices 106a to 106j; production tolerances of one or more of the plurality of electrical energy storage devices 106a to 106j; temperature of one or more of the plurality of electrical energy storage devices 106a to 106j; temperature distribution across two or more of the plurality of electrical energy storage devices 106a to 106j; temperature distribution across one or more groups of electrical energy storage devices of the plurality of electrical energy storage devices 106a to 106j; one or more ageing characteristics of one or more of the plurality of electrical energy storage devices 106a to 106j; strength of one or more of the plurality of electrical energy storage devices 106a to 106j; indications of a likelihood of failure of one or more of the plurality of electrical energy storage devices 106a to 106j; one or more types of electrical energy storage devices of the plurality of electrical energy storage devices 106a to 106j; a manufacturing batch of one or more of the plurality of electrical energy storage devices; charging time for one or more of the plurality of electrical energy storage devices 106a to 106j; reliability of one or more of the plurality of electrical energy storage devices 106a to 106j; past performance of one or more of the plurality of electrical energy storage devices 106a to 106j; whether one or more of the plurality of electrical energy storage devices 106a to 106j matches characteristics of one or more other electrical energy storage devices of the plurality of electrical energy storage devices 106a to 106j; whether one or more of the plurality of electrical energy storage devices 106a to 106j matches age characteristics of one or more other electrical energy storage devices of the plurality of electrical energy storage devices 106a to 106j; whether one or more of the plurality of electrical energy storage devices 106a to 106j matches remaining life expectancy characteristics of one or more other electrical energy storage devices of the plurality of electrical energy storage devices 106a to 106j; whether one or more of the plurality of electrical energy storage devices 106a to 106j matches electrical resistance characteristics of one or more other electrical energy storage devices of the plurality of electrical energy storage devices 106a to 106j; and whether one or more of the plurality of electrical energy storage devices 106a to 106j has been disconnected from a circuit to which others of the plurality of electrical energy storage devices 106a to 106j are connected.

The array 112 may include a plurality of receivers, compartments or receptacles (not shown) to removably receive electrical energy storage devices (e.g., batteries, supercapacitors or ultracapacitors) 106a to 106j for powering of one or more devices connected to the array 112 via the smart manager 102 on electrical terminals 114c and 114d. The electrical terminals 114c and 114d allow charge to be delivered from the electrical energy storage devices 106a to 106j via the smart manager 102, as well as allow charge to be delivered to the electrical energy storage devices 106a to 106j via smart manager 102 for charging or recharging the same. The size of the array 112 shown in FIG. 1 is one example embodiment and, in various embodiments, there may be more or fewer electrical energy storage devices than that shown in the array 112. For example, array 112 illustrated in FIG. 1 may have a capacity capable of simultaneously holding 40, 80 or 120 electrical energy storage devices. Also, there may be one or more empty electrical energy storage device receivers, compartments or receptacles in the array 112.

The electrical energy storage devices 106a to 106j may take a variety of forms, for example batteries (e.g., array of cells) or supercapacitors or ultracapacitors (e.g., array of ultracapacitor cells). For example, the electrical energy storage devices 106a to 106j may take the form of rechargeable battery packs (i.e., including secondary cells or batteries). The electrical energy storage devices 106a to 106j may, for instance, be sized to physically fit, and may have been used to electrically power personal transportation vehicles, such as all-electric scooters or motorbikes or other electric vehicles. Electric scooters and motorbikes are common in many large cities, for example in Asia, Europe and the Middle East. The ability to conveniently reuse batteries in array 112 that were previously used to power such electric vehicles, but no longer have the capacity to power such vehicles, as a back-up power source for buildings or to power other devices may save energy and alleviate air pollution that may otherwise be made as a result of creating or finding new reliable power sources for such uses.

The smart manager 102 may be communicatively coupled to one or more remotely located computer systems. An example of such a remotely located computer system is that of an electrical energy storage device replacement authority 118 that is authorized to replace electrical energy storage devices in the array 112 on an as-needed basis based on information received from the smart manager 102. The electrical energy storage device replacement authority 118 may collect data from and/or control a plurality of systems for utilizing arrays of electrical energy storage devices, such as the system 100 for utilizing the array 112 of electrical energy storage devices 106a to 106j shown in FIG. 1. The communications may occur over one or more communications channels including one or more networks 122 to which the smart manager 102 is connected via communication line 110, or non-networked communications channels. Communications may be over one or more wired communications channels (e.g., twisted pair wiring, optical fiber), wireless communications channels (e.g., radio, microwave, satellite, 801.11 compliant). Networked communications channels may include one or more local area networks (LANs), wide area networks (WANs), extranets, intranets, or the Internet including the Worldwide Web portion of the Internet. In some embodiments, the smart manager 102 may also include a user interface (not shown). The user interface may include a variety of input/output (I/O) devices to allow an end user to interact with system 100 for utilizing an array of electrical energy storage devices.

Figure 2:
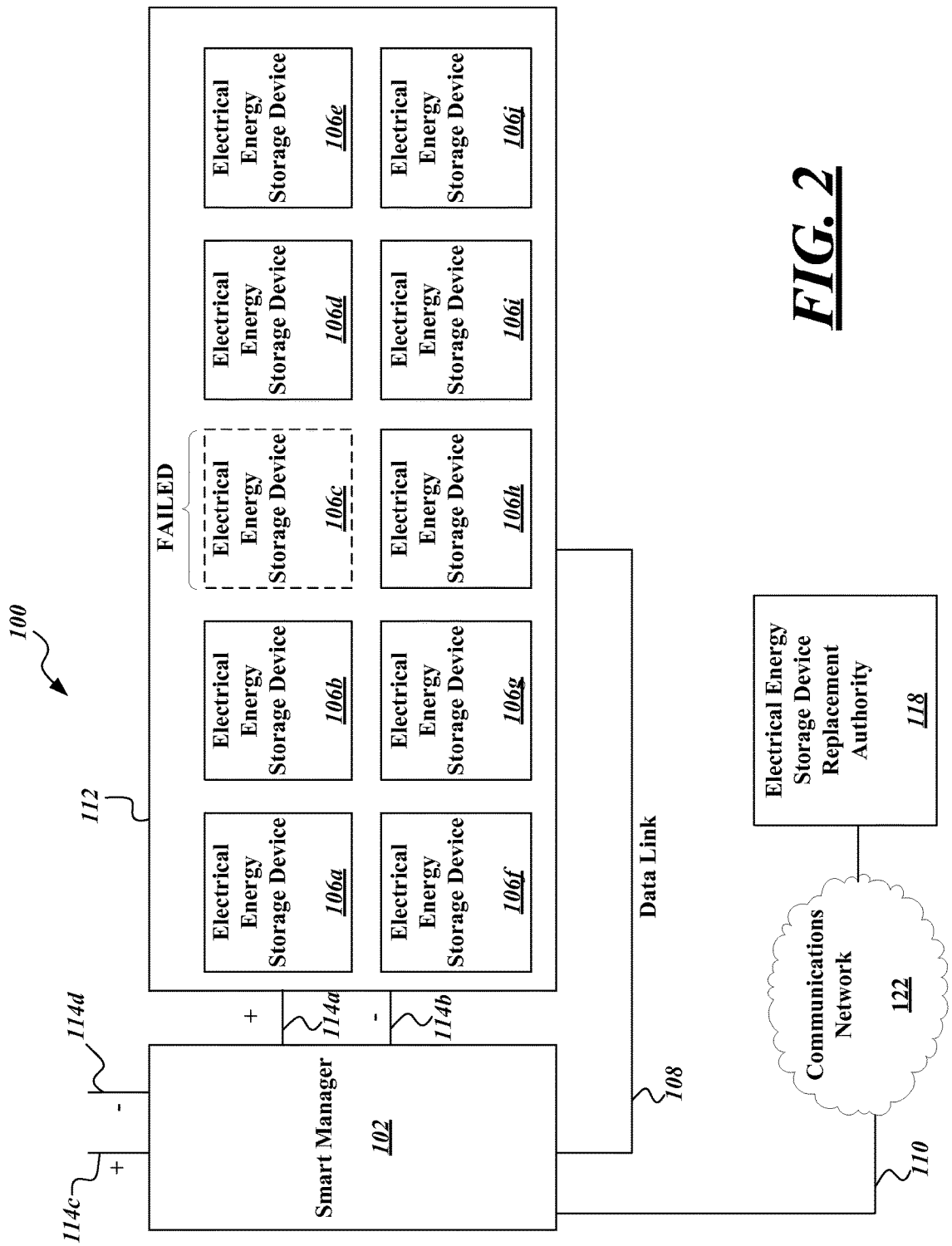
FIG. 2 is a schematic view of the system for utilizing an array of electrical energy storage devices of FIG. 1 showing one of the electrical energy storage devices in the array as being faulty, according to one non-limiting illustrated embodiment.

FIG. 2 is a schematic view of the system 100 of FIG. 1 for utilizing an array of electrical energy storage devices and shows one of the electrical energy storage devices in the array 112 as being faulty, according to one non-limiting illustrated embodiment.

For example, if all electrical energy storage devices 106a to 106j in the array 112 have a capacity of 2 AH, then the combined capacity is 20 AH. If electrical energy storage device 106c, for example, experiences a short or fault, then electrical energy storage device 106c can disconnect itself from the electrical circuit of the array 112. In that case, the capacity of the array 112 becomes 18 AH. A signal can be sent to the electrical energy storage device replacement authority 118 via communication line 110 over network 122 to initiate a replacement of electrical energy storage device 106c.

Figure 3A:
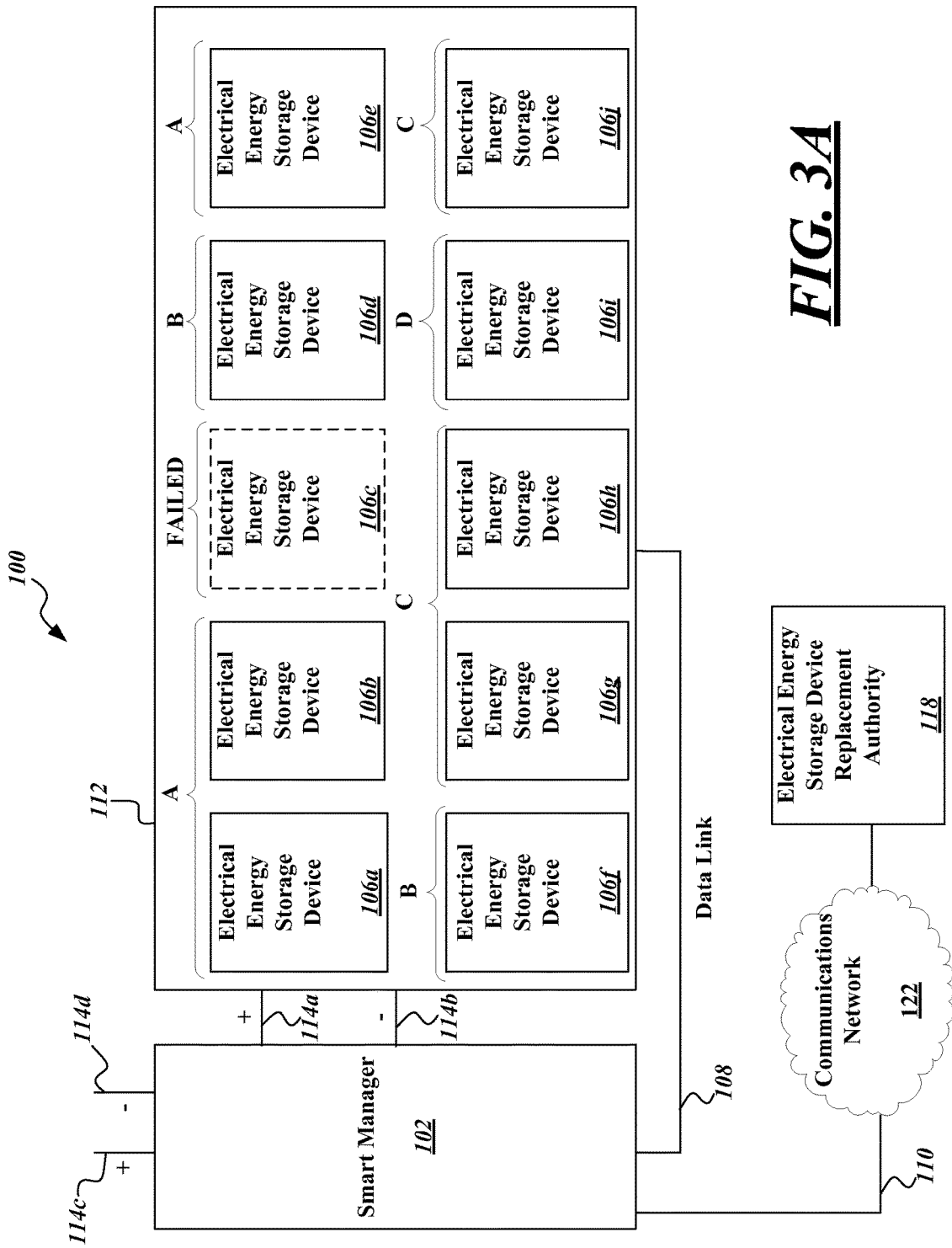
FIG. 3A is a schematic view of the system for utilizing an array of electrical energy storage devices of FIG. 2 showing the electrical energy storage devices in the array categorized according to electrical energy storage device characteristics, according to one non-limiting illustrated embodiment.

FIG. 3A is a schematic view of the system 100 for utilizing an array of electrical energy storage devices of FIG. 2 showing the electrical energy storage devices 106a to 106j in the array categorized according to electrical energy storage device characteristics, according to one non-limiting illustrated embodiment.

For example, in the array 112, the braces shown in FIG. 3A indicate into which category (A, B, C or D) each electrical energy storage device 106a to 106j has been categorized by the smart manager 102 based on electrical energy storage device status information received over data link 108. While each electrical energy storage device 106a to 106j began life with the same capacity, because each electrical energy storage device 106a to 106j is at a different stage of end-of-life in the present example, the internal resistance of each electrical energy storage device 106a to 106j can be dramatically different. In the present example, electrical energy storage devices in category A are 30% of original capacity, electrical energy storage devices in category B are 40% of original capacity, electrical energy storage devices in category C are 50% of original capacity and electrical energy storage devices in category D are 60% of original capacity (see also the table in FIG. 3B for reference). There may be fewer or additional relevant categories depending on the differences in capacities of the electrical energy storage devices 106a to 106j in the array 112 and other information regarding status of the electrical energy storage devices 106a to 106j in the array 112. These categories may be dynamically updated and/or changed by the smart manager 102 based on the information received over data link 108 regarding status of the electrical energy storage devices 106a to 106j in the array 112.

FIG. 3B is a table showing a depletion plan determined by the system 100 for utilizing an array of electrical energy storage devices of FIG. 3A based on the categorizations of the electrical energy storage devices 106a to 106j in the array 112, according to one non-limiting illustrated embodiment.

The smart manager 102 may be configured to isolate failed/shorted electrical energy storage devices in the array 112 such as failed electrical energy storage device 106c, but it may also put electrical energy storage devices into parallel configurations according to their categories which are based on electrical energy storage device age and, thus, individual internal electrical resistance of the electrical energy storage device. For example, as shown in the depletion plan determined by the smart manager 102 illustrated in the table in FIG. 3B, electrical energy storage devices 106a, 106b and 106e in category A are to be depleted together, followed by electrical energy storage devices 106d and 106f in category B, followed by electrical energy storage devices 106g, 106h and 106j in category D, and finally followed by electrical energy storage device 106i in category D. In various embodiments the categories may be based on electrical energy storage device age and/or other applicable electrical energy storage device status information received over data link 108 indicative of the presently existing internal electrical resistance of the individual electrical energy storage devices 106a to 106j.

In the example above, a limited number of electrical energy storage devices are shown for ease of reference. However, a greater benefit may be provided when the system 100 includes a very large array of electrical energy storage devices that are assembled without any regard to their actual capacity. Historically, much care and effort had been required when assembling a large array of electrical energy storage devices, but the system 100 for utilizing an array of electrical energy storage devices as provided herein saves such time and effort by helping to alleviate the need to carefully consider and physically reconfigure the location of individual electrical energy storage devices in the array 112. The system 100 also facilitates forecasting actual capacity and thus helps to guarantee available capacity and to actively maintain capacity via maintenance crews that need simply remove and replace battery packs as advised by a computer system of the electrical energy storage device replacement authority 118 shown in FIG. 1. In various embodiments, the system 100 facilitates permitting a quality of service (QoS) to be provided to mission critical entities (banks, hospitals, etc.). Also, for example, the array 112 may generate an AC voltage that could provide power routinely (in emerging markets) or supplement power (during failures). In some embodiments, such entities subscribe to a nearly guaranteed capacity that is transparently maintained for them by a service provider that may control the system 100 directly or via communications network 122.

FIG. 4 is a schematic view of the smart manager 102 of the system 100 for utilizing an array of electrical energy storage devices shown in FIG. 1 through FIG. 3B, according to one non-limiting illustrated embodiment.

In the present example embodiment, the smart manager 102 includes a controller 410, a communications subsystem 406, a power interface/manager 420, and alternatively includes read-only memory (ROM) 412, random access memory (RAM) 414 and/or other storage 416.

The controller 410 is, for example, a microprocessor, microcontroller, programmable logic controller (PLC), programmable gate array (PGA), application specific integrated circuit (ASIC) or another controller capable of receiving signals from various sensors, performing logical operations, and sending signals to various components. Typically, the controller 410 may take the form of a microprocessor (e.g., INTEL or AMD). The smart manager 102 may also include one or more non-transitory processor- or computer-readable storage media, for example read-only memory (ROM) 412, random access memory (RAM) 414, and other storage 416 (e.g., solid-state storage media such as flash memory or EEPROM, spinning storage media such as hard disk). The non-transitory processor- or computer-readable storage media 412, 414, 416 may be in addition to any non-transitory storage medium (e.g., registers) which is part of the controller 410. The smart manager 102 may include one or more buses 418 (only one illustrated) coupling various components together, for example one or more power buses, instruction buses, data buses, etc.

Figure 5:
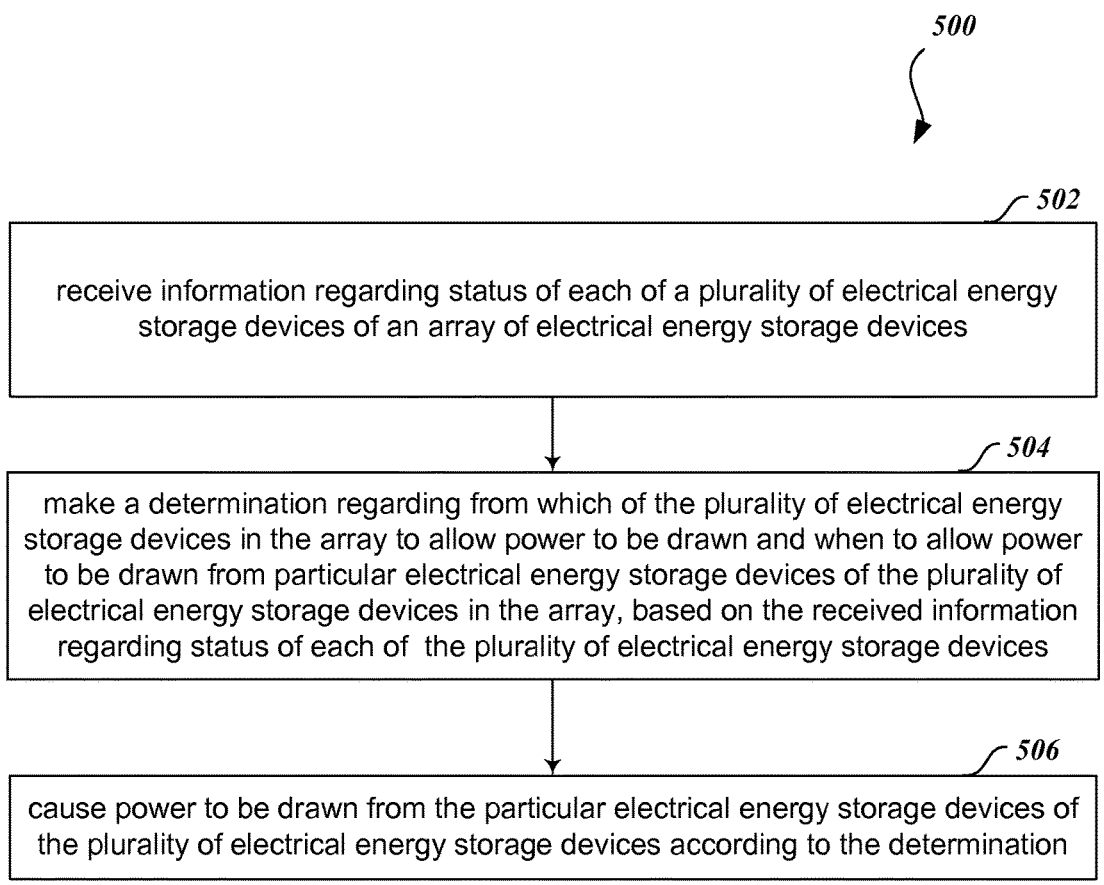
FIG. 5 is a flow diagram showing a high-level method in the system for utilizing an array of electrical energy storage devices shown in FIG. 1 through FIG. 3B, according to one non-limiting illustrated embodiment.
Figure 6:
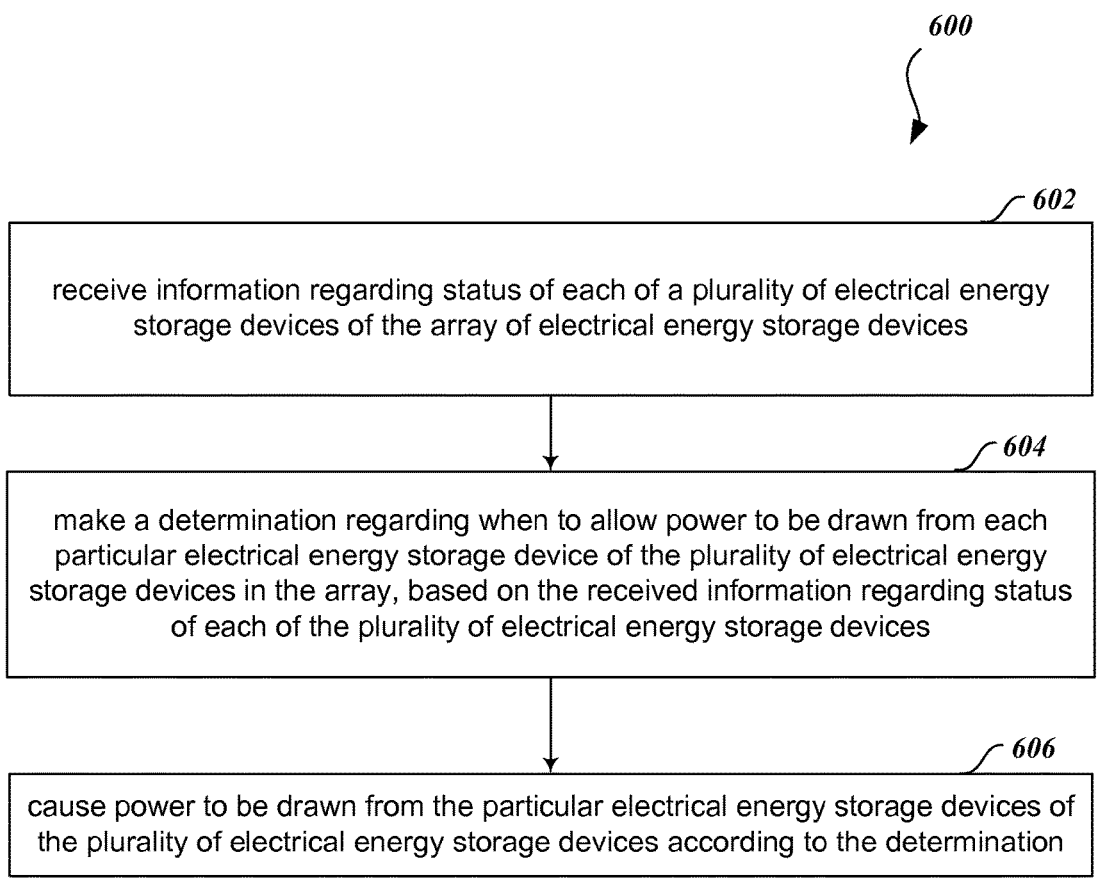
FIG. 6 is a flow diagram showing a high-level method in the system for utilizing an array of electrical energy storage devices shown in FIG. 1 through FIG. 3B, according to an alternative illustrated embodiment.
Figure 7:
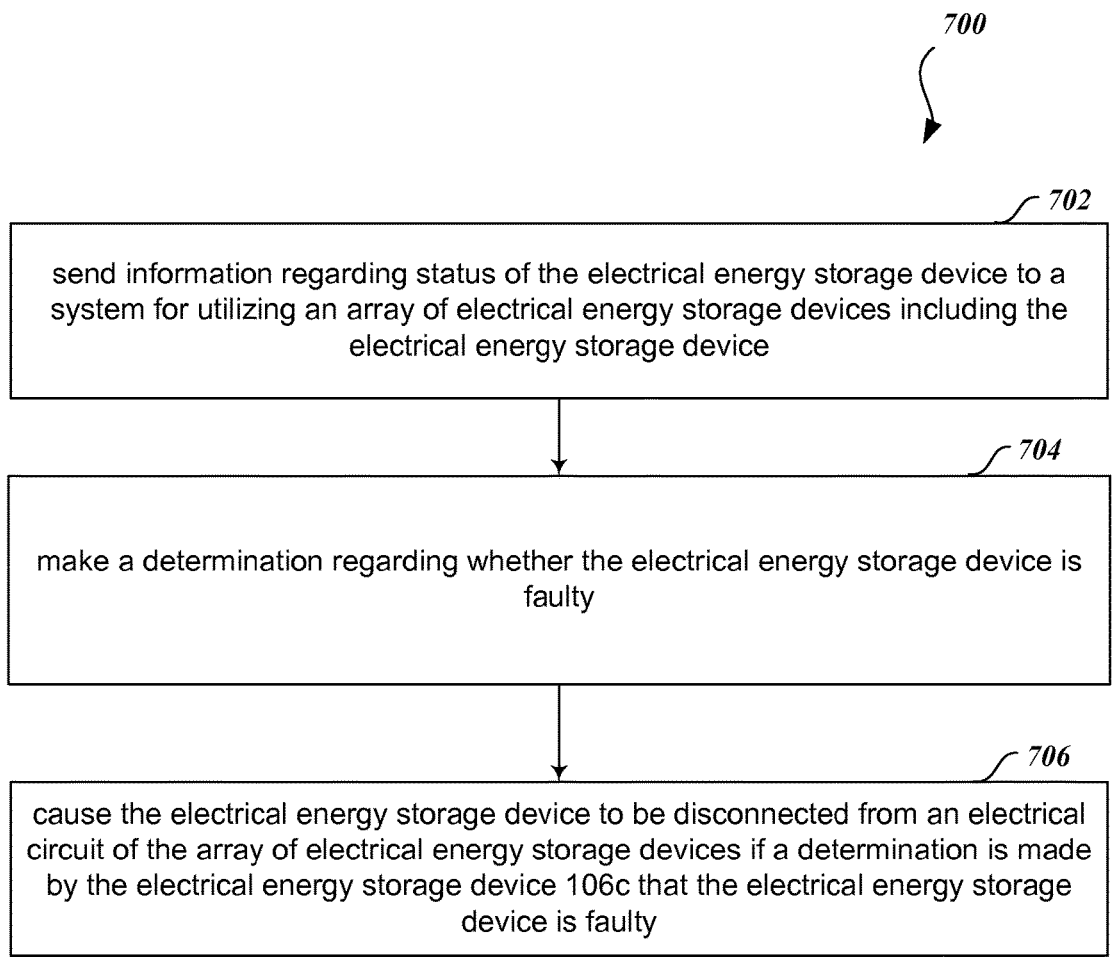
FIG. 7 is a flow diagram showing a high-level method in an example of one of the electrical energy storage devices shown in FIG. 1 through FIG. 3B, according to one non-limiting illustrated embodiment.

As illustrated, the ROM 412, or some other one of the non-transitory processor- or computer-readable storage media 412, 414, 416, stores instructions and/or data or values for variables or parameters. The sets of data may take a variety of forms, for example a lookup table, a set of records in a database, etc. The instructions and sets of data or values are executable by the controller 410. Execution of the instructions and sets of data or values causes the controller 410 to perform specific acts to cause the smart manager 102 to generate control signals that allow or prevent one or more of the electrical energy storage devices 106a to 106j from accepting a charge and/or releasing energy and that cause power to be drawn from one or more particular electrical energy storage devices of electrical energy storage devices 106a to 106j by one or more connected devices. This may be according to a determination made by the controller 410 regarding from which of the plurality of electrical energy storage devices 106a to 106j to allow power to be drawn and when to allow power to be drawn from particular electrical energy storage devices of the plurality of electrical energy storage devices 106a to 106j, based on the received information via communications subsystem 406 regarding status of each of the plurality of electrical energy storage devices 106a to 106j. Specific operation of the smart manager 102 is described herein and also below with reference to various flow diagrams (FIGS. 5-7). The instructions and sets of data or values are executable by the controller 410.

Execution of the instructions and sets of data or values causes the controller 410 to perform specific acts to cause the smart manager 102 to perform the functions of the system 100 described herein. For example, execution of the instructions and sets of data or values causes the controller 410 to perform specific acts to cause the smart manager 102 to determine whether an electrical energy storage device of the plurality of electrical energy storage devices 106a to 106j is faulty based on the received information regarding status of each of the plurality of electrical energy storage devices, and in response to a determination that the electrical energy storage device is faulty, determine to prevent power from being drawn from the electrical energy storage device. Execution of the instructions and sets of data or values also causes the controller 410 to perform specific acts to categorize, based on the received information regarding status, electrical energy storage devices of the plurality of electrical energy storage devices 106a to 106j into categories based on matching characteristics regarding one or more of: electrical energy storage device age, present electrical resistance, amount of remaining capacity of original electrical energy storage device capacity, and life expectancy, of various electrical energy storage devices of the plurality of electrical energy storage devices; for each particular category of the categories into which the electrical energy storage devices of the plurality of electrical energy storage devices 106a to 106j were categorized, enable concurrent depletion of charge of each electrical energy storage device in the particular category with each other electrical energy storage device in the particular category; and determine a depletion plan which indicates an order in which a depletion of charge will occur sequentially for each particular category of electrical energy storage device with respect to each other particular category. In addition, execution of the instructions and sets of data or values causes the controller 410 to perform specific acts to connect, disconnect and/or cause each electrical energy storage device in the particular category to be electrically connected in parallel or series with respect other electrical energy storage devices in the plurality of electrical energy storage devices 106a to 106j in the array 112 shown in FIG. 1 to FIG. 3.

The controller 410 may use RAM 414 in a conventional fashion, for volatile storage of instructions, data, etc. The controller 410 may use data store 416 to log or retain information, for example, information regarding status of the electrical energy storage devices 106a to 106j received via data link 108 or other sources. The instructions are executable by the controller 410 to control operation of the smart manager 102 in response to input from remote systems such as those of external devices including but not limited to: those of electrical energy storage device replacement authority 118, a remote system of a service provider in control of the system 100, user mobile devices, end user or operator input, etc.

The control subsystem may also receive signals from various sensors and/or components of an external device via the communications subsystem 406. This information may include information that characterizes or is indicative of the authenticity, authorization level, operation, status, or condition of such components.

The communications subsystem 406 may include one or more communications modules or components which facilitates communications with the various components of external devices (e.g., such as to receive software updates via communication line 110 or data updates of electrical energy storage devices via data link 108). The communications subsystem 406 may provide wired and/or wireless communications. The communications subsystem 406 may include one or more ports, wireless receivers, wireless transmitters or wireless transceivers to provide wireless signal paths to the various remote components or systems. The communications subsystem 406 may, for example, include components enabling short range (e.g., via Bluetooth, near field communication (NFC), radio frequency identification (RFID) components and protocols) or longer range wireless communications (e.g., over a wireless LAN, satellite, or cellular network) and may include one or more modems or one or more Ethernet or other types of communications cards or components for doing so. The communications network 122 to which the communications subsystem 406 may be communicatively connected may include one or more bridges or routers suitable to handle network traffic including switched packet type communications protocols (TCP/IP), Ethernet or other networking protocols.

In some embodiments, some or all of the components of the smart manager 102 may be located outside smart manager 102 as a separate device that actuates the switches within the array 112 (e.g., via a wireless control signal) sent via the communications subsystem 406.

The Power Interface/Manager 420 is controllable by the controller 410 and is configured to provide power to the smart manager 102 and to one or more devices connected to terminals 114c and 114d from the electrical energy storage devices of the array 112 and generally manages power output of the array 112. For example, Power Interface/Manager 420 may be configured to regulate the release of power from and/or disconnect one or more of the electrical energy storage devices 106a to 106j of the array 112 according to control signals received from the controller 410, and includes various applicable components operable for doing so such as electrical transformers, switches, converters, rectifiers, etc.

FIG. 5 is a flow diagram showing a high-level method 500 in the system 100 for utilizing an array of electrical energy storage devices shown in FIG. 1 through FIG. 3B, according to one non-limiting illustrated embodiment.

At 502, the system 100 for utilizing an array of electrical energy storage devices receives information regarding status of each of a plurality of electrical energy storage devices of an array of electrical energy storage devices.

At 504, the system 100 for utilizing an array of electrical energy storage makes a determination regarding from which of the plurality of electrical energy storage devices in the array to allow power to be drawn and when to allow power to be drawn from particular electrical energy storage devices of the plurality of electrical energy storage devices in the array. This is based on the received information regarding status of each of the plurality of electrical energy storage devices.

At 506, the system 100 for utilizing an array of electrical energy storage causes power to be drawn from the particular electrical energy storage devices of the plurality of electrical energy storage devices according to the determination made in 504.

FIG. 6 is a flow diagram showing a high-level method 600 in the system 100 for utilizing an array of electrical energy storage devices shown in FIG. 1 through FIG. 3B, according to an alternative illustrated embodiment.

At 602, the system 100 for utilizing an array of electrical energy storage devices receives information regarding status of each of a plurality of electrical energy storage devices of the array of electrical energy storage devices.

At 604, the system 100 for utilizing an array of electrical energy storage devices makes a determination regarding when to allow power to be drawn from each particular electrical energy storage device of the plurality of electrical energy storage devices in the array, based on the received information regarding status of each of the plurality of electrical energy storage devices.

At 606, the system 100 for utilizing an array of electrical energy storage devices causes power to be drawn from the particular electrical energy storage devices of the plurality of electrical energy storage devices according to the determination made in 604.

FIG. 7 is a flow diagram showing a high-level method 700 in an example of one of the electrical energy storage devices (e.g., 106c) shown in FIG. 1 through FIG. 3B, according to one non-limiting illustrated embodiment.

At 702, the electrical energy storage device 106c sends information regarding status of the electrical energy storage device 106c to the system 100 for utilizing an array of electrical energy storage devices including the electrical energy storage device 106c.

At 704, the electrical energy storage device 106c makes a determination regarding whether the electrical energy storage device 106c is faulty.

At 706, the electrical energy storage device 106c causes the electrical energy storage device 106c to be disconnected from an electrical circuit of the array 112 if a determination is made by the electrical energy storage device 106c that the electrical energy storage device is faulty.

The various methods described herein may include additional acts, omit some acts, and/or may perform the acts in a different order than set out in the various flow diagrams.

The foregoing detailed description has set forth various embodiments of the devices and/or processes via the use of block diagrams, schematics, and examples. Insofar as such block diagrams, schematics, and examples contain one or more functions and/or operations, in light of the disclosure herein, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via one or more microcontrollers. However, in light of the disclosure herein, those skilled in the art will recognize that the embodiments disclosed herein, in whole or in part, can be equivalently implemented in standard integrated circuits (e.g., Application Specific Integrated Circuits or ASICs), as one or more computer programs executed by one or more computers (e.g., as one or more programs running on one or more computer systems), as one or more programs executed by on one or more controllers (e.g., microcontrollers) as one or more programs executed by one or more processors (e.g., microprocessors), as firmware, or as various combinations thereof, and that designing the circuitry and/or writing the code for the software and/or firmware would be well within the skill of one of ordinary skill in the art in light of the teachings of this disclosure.

When logic is implemented as software and stored in memory, logic or information can be stored on any non-transitory computer-readable medium for use by or in connection with any processor-related system or method. In the context of this disclosure, a memory is a nontransitory computer- or processor-readable storage medium that is an electronic, magnetic, optical, or other physical device or means that non-transitorily contains or stores a computer and/or processor program. Logic and/or the information can be embodied in any computer-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "computer-readable medium" can be any physical element that can store the program associated with logic and/or information for use by or in connection with the instruction execution system, apparatus, and/or device. The computer-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer memory device (magnetic, compact flash card, secure digital, or the like), a random access memory (RAM), a read-only memory (ROM), an erasable programmable read-only memory (EPROM, EEPROM, or Flash memory), and a portable compact disc read-only memory (CDROM).

The various embodiments described above can be combined to provide further embodiments. Aspects of the embodiments can be modified, if necessary, to employ systems, circuits and concepts to provide yet further embodiments in light of the disclosure herein.

While generally discussed in the environment and context of backup power sources, the teachings herein can be applied in a wide variety of other environments, including implementing normal power sources.

The above description of illustrated embodiments, including what is described in the Abstract of the Disclosure, is not intended to be exhaustive or to limit the embodiments to the precise forms disclosed. Although specific embodiments and examples are described herein for illustrative purposes, various equivalent modifications can be made without departing from the spirit and scope of the disclosure, as will be recognized by those skilled in the relevant art in light of the disclosure herein.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

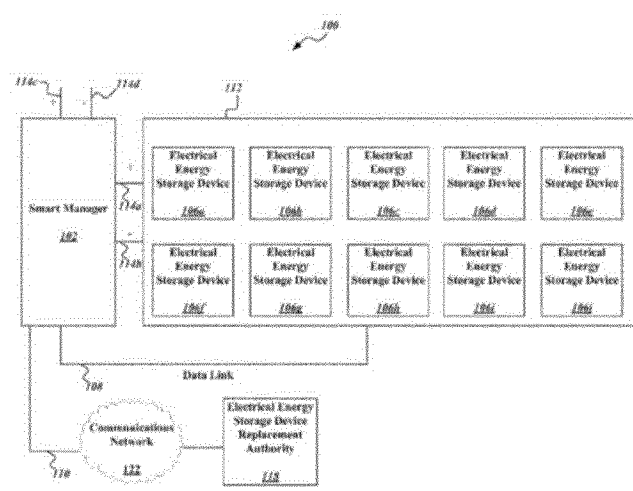

The invention claimed is:

1. A system for utilizing an array of batteries, comprising:
   at least one controller; and
   at least one communications module embedded in each of the batteries, wherein the at least one controller is configured to:
   receive information from the batteries, wherein the received information includes age information of the batteries;
   determine, based on the age information, a first set of batteries having a first age range;
   determine, based on the age information, a second set of batteries having a second age range newer than the first age range;
   connect the first set of batteries in parallel so as to allow power to be drawn from the first set of batteries;
   connect the second set of batteries in parallel the so as to allow power to be drawn from the second set of batteries; and
   selectively connect the batteries in each set to power a load so that batteries in the same age range are utilized at the same time.

2. The system of claim 1 wherein the age information received from each battery includes one or more of: includes an age of each battery; a remaining life expectancy of each battery and a manufacturing batch of each battery.

3. The system of claim 1 wherein the at least one controller is configured to:
   determine from the received information that a battery is faulty;
   in response to the determination that the battery is faulty, prevent power from being drawn from the faulty battery.

4. The system of claim 3 wherein the at least one controller is further configured to:
   disconnect the faulty battery from the set of batteries in the same age range.

5. The system of claim 3 wherein the at least one controller is further configured to:
   send a signal to initiate a replacement of the faulty battery in the set of batteries in the same age range.

6. The system of claim 1 wherein the at least one controller is configured to:
   determine a depletion plan for the first set of batteries and the second set of batteries.

7. The system of claim 6 wherein the at least one controller is configured to:
   cause power to be drawn from the first or second set of batteries according to the determined depletion plan.

8. The system of claim 1 wherein the at least one controller is configured to:
   cause each battery in the first set of batteries to be electrically connected to a first electrical circuit;
   cause each battery in the first set of batteries to be electrically disconnected from the first electrical circuit of the array to prevent further power from being able to be drawn based on detection of a minimum present charge level being reached associated with the first set of batteries;

cause each battery in the second set of batteries to be electrically connected to a second electrical circuit; and cause each battery in the second set of batteries to be electrically disconnected from the second electrical circuit to prevent further power from being able to be drawn based on detection of the minimum present charge level being reached associated with the second set of batteries.

9. The system of claim 7 wherein the at least one controller is further configured to forecast actual electrical energy capacity of the batteries in each set based on the age information.

10. The system of claim 7 wherein the array of batteries is operably connected to the at least one controller.

11. The system of claim 10 wherein the array of batteries is operably connected to the at least one controller via a communications link and via an electrical circuit.

12. A method performed by a system for utilizing an array of batteries, the method comprising:
receiving, information from the batteries, wherein the received information includes age information of the batteries;
determining, by a controller of the system based on the age information, a first set of batteries having a first age range;
determining, by the controller based on the age information, a second set of batteries having a second age range newer than the first age range;
connecting the first set of batteries in parallel so as to allow power to be drawn from the first set of batteries;
connecting the second set of batteries in parallel so as to allow power to be drawn from the second set of batteries; and
connecting the batteries in each set to power a load so that batteries in the same age range are utilized at the same time.

13. The method of claim 12, further comprising determining that a battery of the batteries is faulty based on the received information; and
in response to the determination that the battery is faulty, preventing power from being drawn from the faulty battery.

14. The method of claim 13, further comprising:
sending a signal to initiate a replacement of the faulty battery.

15. A non-transitory computer readable storage medium having computer executable instructions thereon that, when executed cause a processor of a system for utilizing an array of batteries to:
receive information from each of the batteries via at least one communications module embedded in each of the batteries, wherein the received information includes age information of the batteries;
determine, based on the age information, a first set of batteries having a first age range;
determine, based on the age information, a second set of batteries having a second age range newer than the first age range;
connect the first set of batteries in parallel so as to allow power to be drawn from the first set of batteries;
connect the second set of batteries in parallel so as to allow power to be drawn from the second set of batteries; and selectively connect the batteries in each set to power a load so that batteries in the same age range are utilized at the same time.

16. The non-transitory computer readable storage medium of claim 15 wherein one or more of the batteries are portable batteries.

17. The non-transitory computer readable storage medium of claim 15 wherein one or more of the batteries are used portable batteries previously used to power an electric vehicle and the array of batteries is a back-up power supply for a building.

18. The non-transitory computer readable storage medium of claim 15 wherein the batteries include individual cells.

19. The non-transitory computer readable storage medium of claim 15 wherein the batteries include a battery pack.

20. A method performed by a battery controller, comprising:
receiving, from a communications module embedded in each of the batteries, information of the batteries, wherein the received information includes age information of the batteries;
determining, based on the age information, a first set of batteries having a first age range;
determining, based on the age information, a second set of batteries having a second age range newer than the first age range;
connecting the first set of batteries in parallel so as to allow power to be drawn from the first set of batteries;
connecting the second set of batteries in parallel so as to allow power to be drawn from the second set of batteries; and
connecting the batteries in each set to power a load so that batteries in the same age range are utilized at the same time.

21. The method of claim 20, wherein the age information includes an age of the battery.

22. The method of claim 20, wherein the age information includes a remaining life expectancy of the battery.

23. The method of claim 20, wherein the age information includes a remaining life expectancy of the battery.

24. The method of claim 20, wherein the age information includes a manufacturing batch of the battery.

25. The method of claim 20, further comprising:
connecting the first set of batteries in parallel by controlling one or more switches; and
connecting the second set of batteries in parallel by controlling one or more switches.

26. The method of claim 20, further comprising:
connecting the first set of batteries in parallel by controlling one or more transformers; and
connecting the second set of batteries in parallel by controlling one or more transformers.

27. The method of claim 20, further comprising:
connecting the first set of batteries in parallel by controlling one or more converters; and
connecting the second set of batteries in parallel by controlling one or more second converters.

28. The method of claim 20, further comprising:
connecting the first set of batteries in parallel by controlling one or more rectifiers; and
connecting the second set of batteries in parallel by controlling one or more rectifiers.

* * * * *

UNITED STATES PATENT AND TRADEMARK OFFICE
CERTIFICATE OF CORRECTION

PATENT NO. : 9,837,842 B2
APPLICATION NO. : 14/601840
DATED : December 5, 2017
INVENTOR(S) : Taylor et al.

Page 1 of 5

It is certified that error appears in the above-identified patent and that said Letters Patent is hereby corrected as shown below:

On the Title Page

Under abstract, it should read 27 Claims, 8 Drawing Sheets as shown on the attached title page.

In the Claims

Please replace Claims 1-28 with renumbered Claims 1-27 as below:

1. A system for utilizing an array of batteries, comprising:
at least one controller; and
at least one communications module embedded in each of the batteries, wherein the at least one controller is configured to:
receive information from the batteries, wherein the received information includes age information of the batteries;
determine, based on the age information, a first set of batteries having a first age range;
determine, based on the age information, a second set of batteries having a second age range newer than the first age range;
connect the first set of batteries in parallel so as to allow power to be drawn from the first set of batteries;
connect the second set of batteries in parallel the so as to allow power to be drawn from the second set of batteries; and
selectively connect the batteries in each set to power a load so that batteries in the same age range are utilized at the same time.

2. The system of claim 1 wherein the age information received from each battery includes one or more of:
includes an age of each battery; a remaining life expectancy of each battery and a manufacturing batch of each battery.

3. The system of claim 1 wherein the at least one controller is configured to:

Signed and Sealed this
Sixth Day of April, 2021

Drew Hirshfeld
*Performing the Functions and Duties of the
Under Secretary of Commerce for Intellectual Property and
Director of the United States Patent and Trademark Office* determine from the received information that a battery is faulty;
in response to the determination that the battery is faulty, prevent power from being drawn from the faulty battery.

4. The system of claim 3 wherein the at least one controller is further configured to:
disconnect the faulty battery from the set of batteries in the same age range.

5. The system of claim 3 wherein the at least one controller is further configured to:
send a signal to initiate a replacement of the faulty battery in the set of batteries in the same age range.

6. The system of claim 1 wherein the at least one controller is configured to:
determine a depletion plan for the first set of batteries and the second set of batteries.

7. The system of claim 6 wherein the at least one controller is configured to:
cause power to be drawn from the first or second set of batteries according to the determined depletion plan.

8. The system of claim 1 wherein the at least one controller is configured to:
cause each battery in the first set of batteries to be electrically connected to a first electrical circuit;
cause each battery in the first set of batteries to be electrically disconnected from the first electrical circuit of the array to prevent further power from being able to be drawn based on detection of a minimum present charge level being reached associated with the first set of batteries;
cause each battery in the second set of batteries to be electrically connected to a second electrical circuit; and
cause each battery in the second set of batteries to be electrically disconnected from the second electrical circuit to prevent further power from being able to be drawn based on detection of the minimum present charge level being reached associated with the second set of batteries.

9. The system of claim 7 wherein the at least one controller is further configured to forecast actual electrical energy capacity of the batteries in each set based on the age information.

10. The system of claim 7 wherein the array of batteries is operably connected to the at least one controller.

11. The system of claim 10 wherein the array of batteries is operably connected to the at least one controller via a communications link and via an electrical circuit.

12. A method performed by a system for utilizing an array of batteries, the method comprising:
receiving, information from the batteries, wherein the received information includes age information of the batteries;
determining, by a controller of the system based on the age information, a first set of batteries having a first age range;
determining, by the controller based on the age information, a second set of batteries having a second age range newer than the first age range;
connecting the first set of batteries in parallel so as to allow power to be drawn from the first set of batteries;

connecting the second set of batteries in parallel so as to allow power to be drawn from the second set of batteries; and
connecting the batteries in each set to power a load so that batteries in the same age range are utilized at the same time.

13. The method of claim 12, further comprising determining that a battery of the batteries is faulty based on the received information; and
in response to the determination that the battery is faulty, preventing power from being drawn from the faulty battery.

14. The method of claim 13, further comprising:
sending a signal to initiate a replacement of the faulty battery.

15. A non-transitory computer readable storage medium having computer executable instructions thereon that, when executed cause a processor of a system for utilizing an array of batteries to:
receive information from each of the batteries via at least one communications module embedded in each of the batteries, wherein the received information includes age information of the batteries;
determine, based on the age information, a first set of batteries having a first age range;
determine, based on the age information, a second set of batteries having a second age range newer than the first age range;
connect the first set of batteries in parallel so as to allow power to be drawn from the first set of batteries;
connect the second set of batteries in parallel so as to allow power to be drawn from the second set of batteries; and
selectively connect the batteries in each set to power a load so that batteries in the same age range are utilized at the same time.

16. The non-transitory computer readable storage medium of claim 15 wherein one or more of the batteries are portable batteries.

17. The non-transitory computer readable storage medium of claim 15 wherein one or more of the batteries are used portable batteries previously used to power an electric vehicle and the array of batteries is a back-up power supply for a building.

18. The non-transitory computer readable storage medium of claim 15 wherein the batteries include individual cells.

19. The non-transitory computer readable storage medium of claim 15 wherein the batteries include a battery pack.

20. A method performed by a battery controller, comprising:
receiving, from a communications module embedded in each of the batteries, information of the batteries,
wherein the received information includes age information of the batteries;
determining, based on the age information, a first set of batteries having a first age range;
determining, based on the age information, a second set of batteries having a second age range newer than the first age range;
connecting the first set of batteries in parallel so as to allow power to be drawn from the first set of batteries;
connecting the second set of batteries in parallel so as to allow power to be drawn from the second set of batteries; and
connecting the batteries in each set to power a load so that batteries in the same age range are utilized at the same time.

21. The method of claim 20, wherein the age information includes an age of the battery.

22. The method of claim 20, wherein the age information includes a remaining life expectancy of the battery.

23. The method of claim 20, wherein the age information includes a manufacturing batch of the battery.

24. The method of claim 20, further comprising:
connecting the first set of batteries in parallel by controlling one or more switches; and
connecting the second set of batteries in parallel by controlling one or more switches.

25. The method of claim 20, further comprising:
connecting the first set of batteries in parallel by controlling one or more transformers; and
connecting the second set of batteries in parallel by controlling one or more transformers.

26. The method of claim 20, further comprising:
connecting the first set of batteries in parallel by controlling one or more converters; and
connecting the second set of batteries in parallel by controlling one or more second converters.

27. The method of claim 20, further comprising:
connecting the first set of batteries in parallel by controlling one or more rectifiers; and
connecting the second set of batteries in parallel by controlling one or more rectifiers.

CERTIFICATE OF CORRECTION (continued)

(12) United States Patent
Taylor et al.

(10) Patent No.: US 9,837,842 B2
(45) Date of Patent: Dec. 5, 2017

(54) SYSTEMS AND METHODS FOR UTILIZING AN ARRAY OF POWER STORAGE DEVICES, SUCH AS BATTERIES

(71) Applicant: Gogoro Inc., Hong Kong (CN)

(72) Inventors: Matthew Whiting Taylor, North Bend, WA (US); Hok-Sum Horace Luke, Mercer Island, WA (US)

(73) Assignee: Gogoro Inc., Hong Kong (CN)

( * ) Notice: Subject to any disclaimer, the term of this patent is extended or adjusted under 35 U.S.C. 154(b) by 222 days.

(21) Appl. No.: 14/601,840

(22) Filed: Jan. 21, 2015

(65) Prior Publication Data
US 2015/0207355 A1 Jul. 23, 2015

Related U.S. Application Data

(60) Provisional application No. 61/930,727, filed on Jan. 23, 2014.

(51) Int. Cl.
H02J 7/00 (2006.01)
H02J 7/34 (2006.01)

(52) U.S. Cl.
CPC ............ *H02J 7/0063* (2013.01); *H02J 7/345* (2013.01); *H02J 2007/0067* (2013.01)

(58) Field of Classification Search
CPC ................. H02J 7/0016; H02J 7/0024
(Continued)

(56) References Cited

U.S. PATENT DOCUMENTS 1,387,848 A 8/1921 Good
3,470,974 A 10/1969 Pefine
(Continued)

FOREIGN PATENT DOCUMENTS

CA 2 865 976 A1 9/2013
DE 44 32 539 A1 6/1995
(Continued)

OTHER PUBLICATIONS

"Inrunner," retrieved from URL=http://en.wikipedia.org/w/index.php?title=Inrunner&printable=yes on Sep. 28, 2011, 1 page.
(Continued)

*Primary Examiner* — Edward Tso
*Assistant Examiner* — Ahmed Omar
(74) *Attorney, Agent, or Firm* — Perkins Coie LLP

(57) ABSTRACT

A system for utilizing an array of electrical energy storage devices utilizes a smart manager that categorizes electrical energy storage devices in the array based on electrical energy storage device age and/or internal resistance level and causes those electrical energy storage devices with similar ages and/or resistance levels to be concurrently depleted. This is followed by concurrently depleting the electrical energy storage devices in a different category. The system also disconnects faulty electrical energy storage devices in the array and helps alleviate the need to carefully consider and reconfigure the location of individual electrical energy storage devices in the array. The system facilitates forecasting actual capacity and thus helps to guarantee available capacity and to actively maintain capacity via maintenance crews that need simply remove and replace cells as advised by the smart manager. The system 100 facilitates permitting a quality of service (QoS) to be provided to mission critical entities (banks, hospitals, etc.).

27 Claims 8 Drawing Sheets